(12) United States Patent
Lai et al.

(10) Patent No.: US 8,618,837 B2
(45) Date of Patent: Dec. 31, 2013

(54) MULTI-STAGE DIGITALLY-CONTROLLED POWER AMPLIFIER

(75) Inventors: Jie-Wei Lai, Taipei (TW);
Meng-Hsiung Hung, Hsinchu (TW);
Robert Bogdan Staszewski, Delft (NL)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/485,941

(22) Filed: Jun. 1, 2012

(65) Prior Publication Data

US 2013/0094606 A1    Apr. 18, 2013

Related U.S. Application Data

(60) Provisional application No. 61/548,095, filed on Oct. 17, 2011.

(51) Int. Cl.
*H03K 19/00* (2006.01)
(52) U.S. Cl.
USPC ............................. 326/93; 326/87; 330/264
(58) Field of Classification Search
USPC ........... 326/82–87, 93–98; 330/262–264, 277
See application file for complete search history.

(56) References Cited

U.S. PATENT DOCUMENTS

| | | | |
|---|---|---|---|
| 7,149,271 B2 * | 12/2006 | Yamada et al. | 326/30 |
| 7,759,992 B2 * | 7/2010 | Ibuka | 327/158 |
| 7,929,637 B2 | 4/2011 | Staszewski | |
| 8,004,368 B2 | 8/2011 | Presti | |
| 8,319,530 B2 * | 11/2012 | Zhao et al. | 327/112 |
| 8,411,793 B2 | 4/2013 | Staszewski | |
| 2002/0030529 A1 | 3/2002 | Lee | |
| 2003/0042984 A1 * | 3/2003 | Moloudi et al. | 330/301 |
| 2011/0200076 A1 * | 8/2011 | Mu et al. | 375/219 |
| 2011/0276113 A1 | 11/2011 | Cybulski | |

OTHER PUBLICATIONS

Lai, A World-Band Triple-Mode 802.11a/b/g SOC in 130-nm CMOS, pp. 2911-2921, vol. 44, No. 11, IEEE Journal of Solid-State Circuits, Nov. 2009.

Mehta, A 0.8mm2 All-Digital SAW-Less Polar Transmitter in 65nm EDGE SoC, pp. 58-59 and a page showing Figure 3.2.7, ISSCC 2010/ Session 3/ Cellular Techniques/ 3.2.

Jerng, A Wideband Delta-Sigma Digital-RF Modulator for High Data Rate Transmitters, pp. 1710-1722, Vol. 42, No. 8, IEEE Journal of Solid-State Circuits, Aug. 2007.

Chowdhury, A 2.4GHz Mixed-Signal Polar Power Amplifier with Low-Power Integrated Filtering in 65nm CMOS, pp. 1-4, Custom Integrated Circuits Conference (CICO), 2010 IEEE.

Boos, A Fully Digital Multimode Polar Transmitter Employing 17b RF DAC in 3G Mode, pp. 376-377 and a page showing Figure 21.7.7, ISSCC 2011/ Session 21/ Cellular/ 21.7.

\* cited by examiner

*Primary Examiner* — Don Le
(74) *Attorney, Agent, or Firm* — Winston Hsu; Scott Margo

(57) ABSTRACT

A multi-stage digitally-controlled power amplifier (DPA) includes a radio-frequency (RF) clock input, an amplitude control word (ACW) input, a plurality of drivers, and an output stage. The RF clock input is arranged for receiving an RF clock. The ACW input is arranged for receiving a digital ACW signal. The drivers are coupled to the RF clock, and arranged for producing a plurality of intermediate signals, wherein at least one driver of the drivers is responsive to at least one bit of the digital ACW signal. The output stage is coupled to the intermediate signals, and arranged for producing an output signal.

17 Claims, 22 Drawing Sheets

MULTI-STAGE DIGITALLY-CONTROLLED POWER AMPLIFIER

CROSS REFERENCE TO RELATED APPLICATIONS

This application claims the benefit of U.S. provisional application No. 61/548,095, filed on Oct. 17, 2011 and incorporated herein by reference.

BACKGROUND

The disclosed embodiments of the present invention relate to power amplification, and more particularly, to a multi-stage digitally-controlled power amplifier.

A polar transmitter offers some advantages, such as a potential for reducing complexity and current consumption in the modulator path as well as eliminating the problem of image rejection, thus the polar transmitter is more suitable for implementation in advanced complementary metal oxide semiconductor (CMOS) processing technologies. More specifically, the polar transmitter is a transmitting device that splits a complex baseband signal explicitly represented by an amplitude-modulated (AM) contented component and a phase-modulated (PM) contented component, instead of an explicit in-phase component and a quadrature component. These two orthogonal components are then recombined into a radio-frequency (RF) output signal to be transmitted over the air.

An all-digital radio-frequency (RF) transmitter front-end circuit may be employed by the polar transmitter to enhance power efficiency, reduce the hardware cost and reduce the chip size. One conventional implementation of the all-digital RF transmitter front-end circuit is a digitally-controlled power amplifier (DPA), acting as an RF digital-to-analog converter (RF-DAC). The DPA may include a plurality of DPA cells for combining the AM signal and the PM signal and delivering an integral signal having a desired RF carrier frequency and a required power level. Therefore, how to arrange and control these DPA cells to achieve the desired DPA functionality is a significant concern in the pertinent field.

Regarding a conventional design of a DPA cell, a high-efficiency switching-mode (inverse class-D/class-E) power amplifier is employed. However, current switching-mode DPAs are inductor-loaded. Thus, due to the inherent characteristics of the inductor-loaded switching-mode amplifier, the voltage swing will be greater than $\pi \times V_{DD}$, where $V_{DD}$ is the supply voltage. To reduce the voltage swing, a lower supply voltage $V_{DD}$ must be used. For example, a DC-DC converter and/or a low-dropout (LDO) regulator may be used to convert a high DC voltage provided by a battery into a low supply voltage $V_{DD}$ needed by the DPA. Unfortunately, the battery efficiency would be degraded due to the power conversion.

Besides, the AM sampling using a periodic sampling clock would introduce out-of-band (OOB) noise/replica. One conventional solution to reduce the OOB noise/replica is to use a higher sampling rate. However, this would lead to larger power consumption. Another conventional solution is to use a higher digital-to-analog converter (DAC) resolution. However, this would have layout and physical limit. Yet another conventional solution is to use an RF bandpass filter. However, such an RF bandpass filter has a low quality factor and consumes a large area.

Thus, there is also a need for an innovative DPA cell design which has improved efficiency and can effectively reduce the undesired OOB noise/replica.

Moreover, due to the feedback path established by magnetic coupling and/or direct coupling (e.g., coupling via the printed circuit board (PCB) ground and/or the package ground), the transmitter output may be fed back to a clock source in the transmitter, which may degrade the transmitter performance. Thus, there is also a need for a pulling mitigation mechanism employed to improve the transmitter performance.

SUMMARY

In accordance with exemplary embodiments of the present invention, a multi-stage digitally-controlled power amplifier is proposed.

According to a first aspect of the present invention, an exemplary multi-stage digitally-controlled power amplifier (DPA) is disclosed. The exemplary multi-stage DPA includes a radio-frequency (RF) clock input, an amplitude control word (ACW) input, a plurality of drivers, and an output stage. The RF clock input is arranged for receiving an RF clock. The ACW input is arranged for receiving a digital ACW signal. The drivers are coupled to the RF clock, and arranged for producing a plurality of intermediate signals, wherein at least one driver of the drivers is responsive to at least one bit of the digital ACW signal. The output stage is coupled to the intermediate signals, and arranged for producing an output signal.

According to a second aspect of the present invention, an exemplary multi-stage digitally-controlled power amplifier (DPA) is disclosed. The exemplary multi-stage DPA includes a radio-frequency (RF) clock input, an amplitude control word (ACW) input, and a plurality of cells. The RF clock input is arranged for receiving an RF clock. The ACW input is arranged for receiving a digital ACW signal. The cells are arranged for producing an output signal according to the RF clock and the digital ACW signal, wherein part of the cells are arranged in a tree topology.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
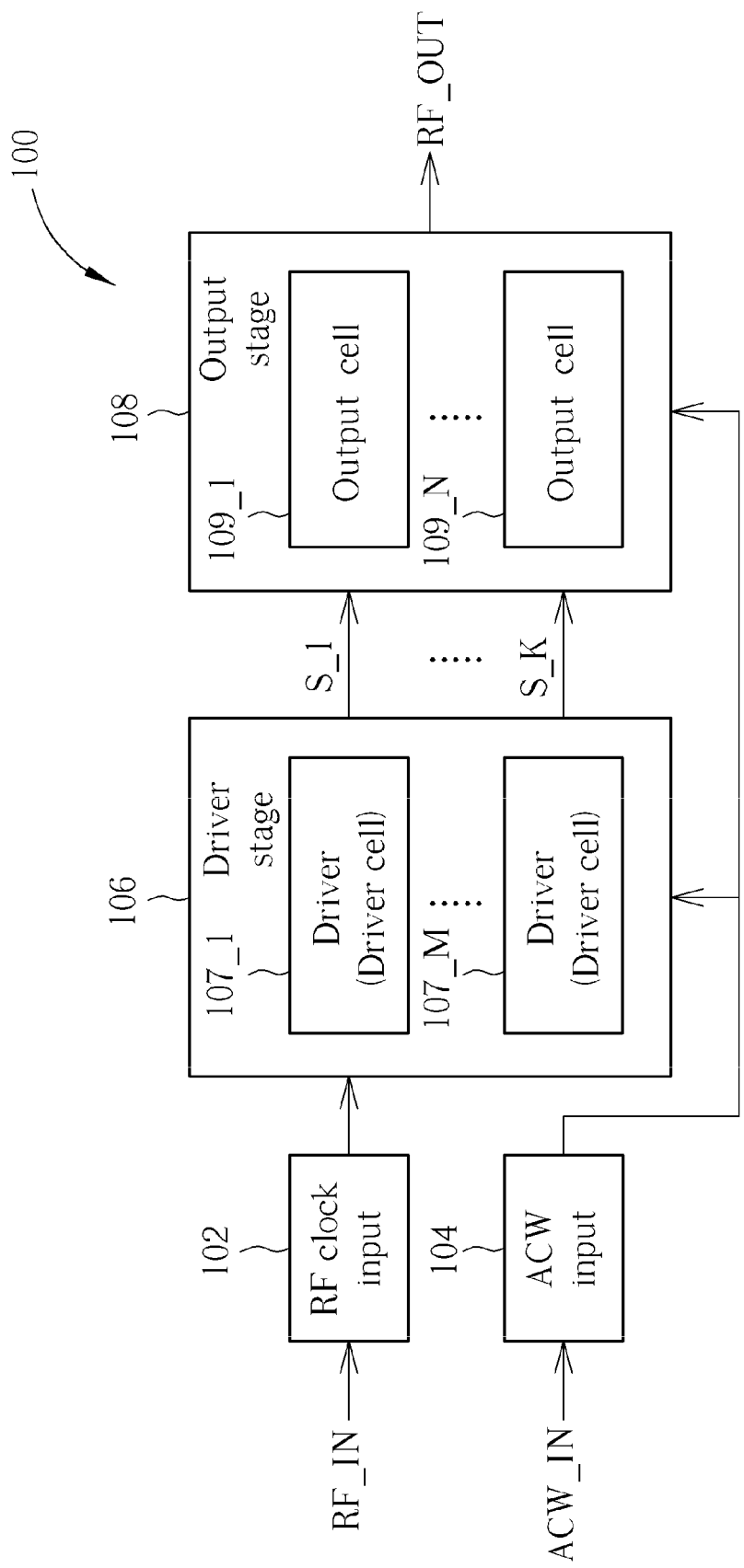
FIG. 1 is a block diagram illustrating a generalized structure of a multi-stage digitally-controlled power amplifier (DPA) according to an exemplary embodiment of the present invention.

FIG. 1 is a block diagram illustrating a generalized structure of a multi-stage digitally-controlled power amplifier (DPA) according to an exemplary embodiment of the present invention. The exemplary multi-stage DPA 100 includes, but is not limited to, a radio-frequency (RF) clock input 102, an amplitude control word (ACW) input 104, a driver stage 106 having a plurality of drivers (i.e., driver cells) 107_1-107_M included therein, and an output stage 108 having a plurality of output cells 109_1-109_N included therein. The RF clock input 102 is arranged for receiving an RF clock RF_IN. For example, the RF clock RF_IN is a phase-contented (PM) signal in a polar transmitter, and therefore carries phase-related information. The ACW input 104 is arranged for receiving a digital ACW signal (e.g., a digital control word) ACW_IN. For example, the digital ACW signal ACW_IN is an amplitude-contented (AM) signal in a polar transmitter, and therefore carries amplitude-related information. The drivers 107_1-107_M are coupled to the RF clock RF_IN, and arranged for producing a plurality of intermediate signals S_1-S_K. Regarding the output stage 108, it is coupled to the driver stage 106 for receiving the intermediate signals S_1-S_K and producing an output signal RF_OUT according to the received intermediate signals S_1-S_K.

In this exemplary design, at least one of the drivers 107_1-107_M is responsive to at least one bit of the digital ACW signal ACW_IN, and/or at least one of the output cells 109_1-109_N is responsive to at least one bit of the digital ACW signal. That is, at least one of the drivers 107_1-107_M is controlled according to at least one bit of the digital ACW signal ACW_IN, and/or at least one of the output cells 109_1-109_N is controlled according to at least one bit of the digital ACW signal. By way of example, but not limitation, one or more output cells may be directly controlled by bit(s) of the digital ACW signal ACW_IN, or may be controlled by control bit(s) derived from processing bit(s) of the digital ACW signal ACW_IN.

In one exemplary design, the DPA cells 107_1-107_M and 109_1-109_N included in the driver stage 106 and the output stage 108 may be arranged in a tree topology or a chain topology, depending upon the interconnections among the DPA cells. Please refer to FIG. 2, which is a diagram illustrating a first implementation of a multi-stage DPA according to an embodiment of the present invention. The multi-stage DPA 200 is based on the hardware configuration shown in FIG. 1, and therefore has a driver stage 206 and an output stage 208, where the driver stage 206 receives an RF clock RF_IN (e.g., a PM signal) from an RF clock input 202, and the output stage 208 receives an ACW input ACW_IN from an ACW input 204. The driver stage 206 has a plurality of cascaded stages 212, 214 and 216. It should be noted that the number of the cascaded stages employed in the driver stage 206 is for illustrative purposes only. The stage 212 includes a plurality of drivers 211, the stage 214 includes a plurality of drivers 213, and the stage 216 includes a plurality of drivers 215. Each driver 211 in stage 212 may be coupled to one or more drivers 213 in the next stage 214. Besides, the number of drivers 213 coupled to one driver 211 may be equal to or different from the number of drivers 213 coupled to another driver 211, depending upon actual design requirement/consideration. In a case where a tree topology is employed, the number of drivers 213 coupled to one driver 211 may be greater than one.

Similarly, each driver 213 in the stage 214 may be coupled to one or more drivers 215 in the next stage 216. Besides, the number of drivers 215 coupled to one driver 213 may be equal to or different from the number of drivers 215 coupled to another driver 213, depending upon actual design requirement/consideration. In a case where a tree topology is employed, the number of drivers 215 coupled to one driver 213 may be greater than one.

Figure 2:
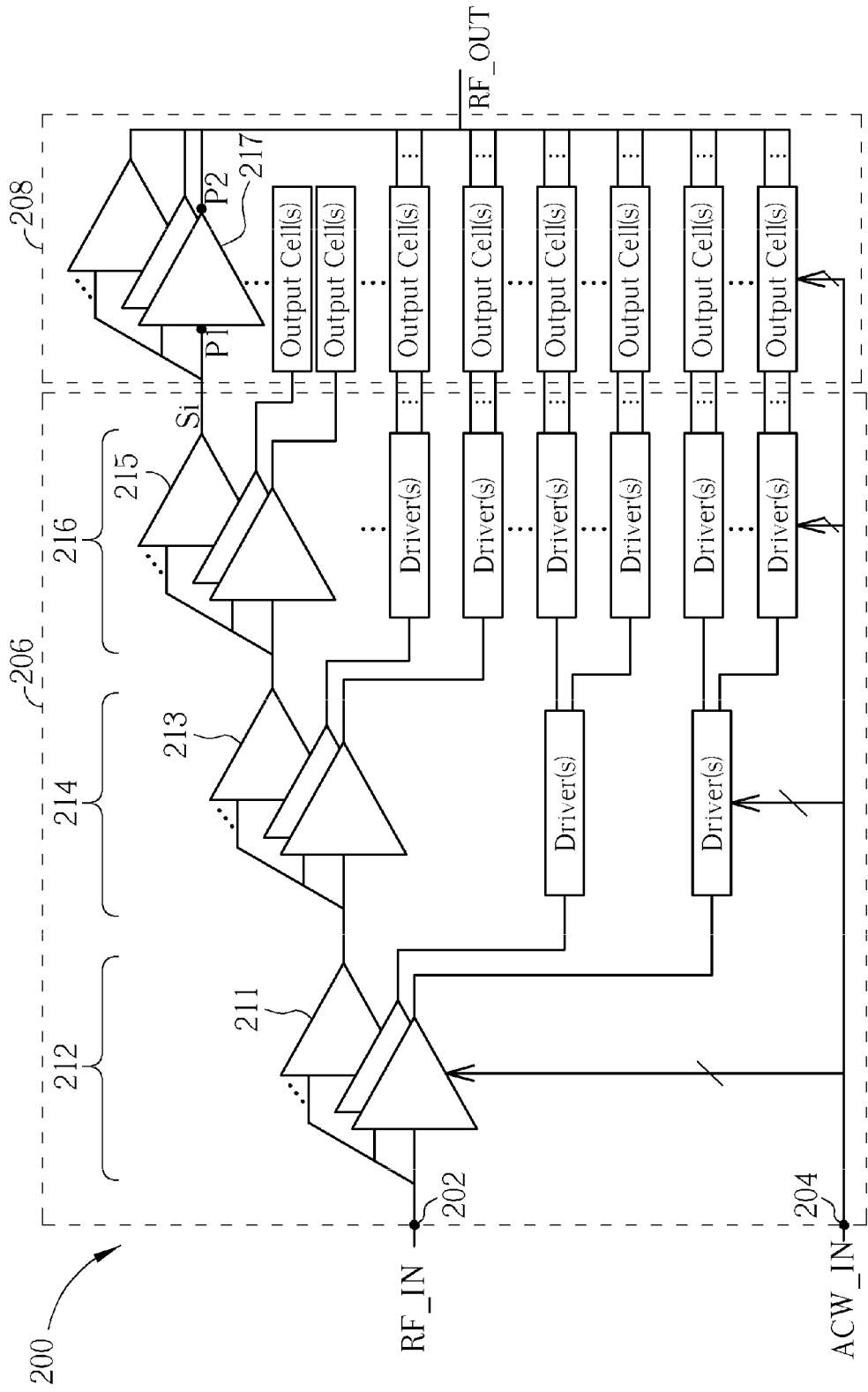
FIG. 2 is a diagram illustrating a first implementation of a multi-stage DPA according to an embodiment of the present invention.

Regarding the output stage 208, it includes a plurality of output cells 217. Each driver 215 in the driver stage 206 is coupled to one or more output cells 217 in the output stage 208. As shown in FIG. 2, each output cell 217 has an input port P1 and an output port P2. The input port P1 is coupled to one of the intermediate signals $S_i$ generated from the drivers 215 located at the last stage 216. Output ports P2 of all output cells 217 are coupled to each other (directly, as shown here, although an indirect coupling could also be used) such that the output signal RF_OUT is derived from a summation of signal outputs of enabled output cells 217. In a case where a tree topology, the number of output cells 217 coupled to one driver 215 may be greater than one.

By way of example, but not limitation, all of the drivers 211, 213, 215 and output cells 217 shown in FIG. 2 may be configured to be responsive to the digital ACW signal ACW_IN for controlling the power level of the output signal RF_OUT. Hence, the discrete drivers 211, 213, 215 included in the driver stage 206 may be controlled independently, and the discrete output cells 217 included in the output stage 208 may be controlled independently. As mentioned above, the driver stage 206 is used to couple the phase-contented and amplitude-contented RF carrier to the output stage 208, and the output stage 208 is used to deliver the integral signal at the RF carrier frequency and required power level. Hence, with proper setting of bits transmitted via the digital ACW signal ACW_IN, the power of the output signal RF_OUT would be set to the required power level.

Figure 3:
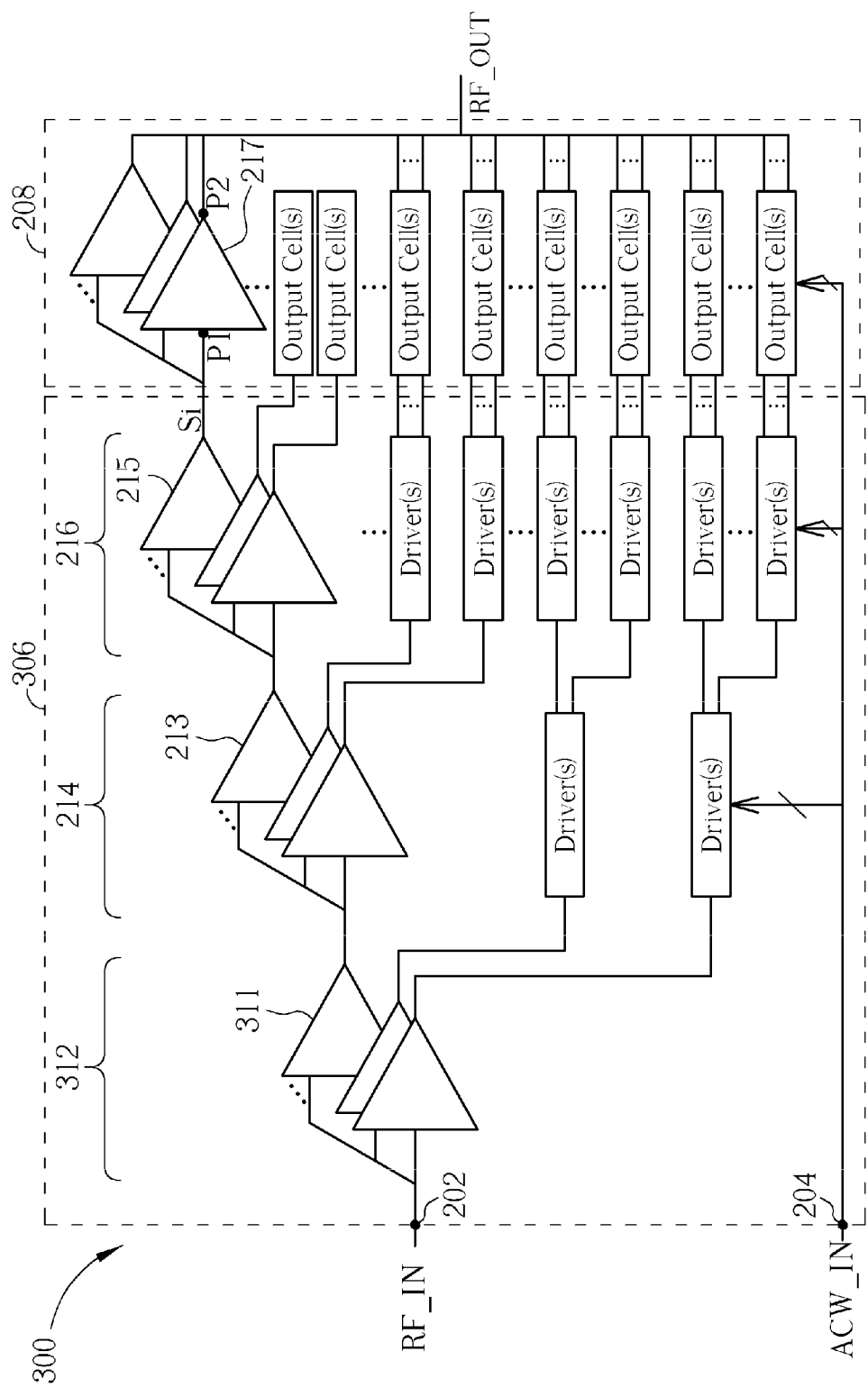
FIG. 3 is a diagram illustrating a second implementation of a multi-stage DPA according to an embodiment of the present invention.

In the example shown in FIG. 2, all of the drivers 211, 213, 215 and output cells 217 included in the multi-stage DPA 200 are responsive to the digital ACW signal ACW_IN. However, this is for illustrative purposes only, and is not meant to be a limitation of the present invention. Please refer to FIG. 3, which is a diagram illustrating a second implementation of a multi-stage DPA according to an embodiment of the present invention. The multi-stage DPA 300 is also based on the hardware configuration shown in FIG. 1. The major difference between the multi-stage DPAs 200 and 300 is that at least one of drivers directly connected to the RF clock input 202 is not responsive to any bit of the digital ACW signal ACW_IN. By way of example, but not limitation, all of the drivers (i.e., driver cells) 311 disposed at the stage 312 shown in FIG. 3 are not controlled by the digital ACW signal ACW_IN. In other words, all of the drivers 311 are enabled when the multi-stage DPA 300 is operative to generate the output signal RF_OUT. One benefit/advantage of such a design is that the load viewed by a preceding circuit component (e.g., a DCO which generates the RF clock RF_IN) would be constant, thus improving stability and accuracy of the overall transmitter system.

Figure 4:
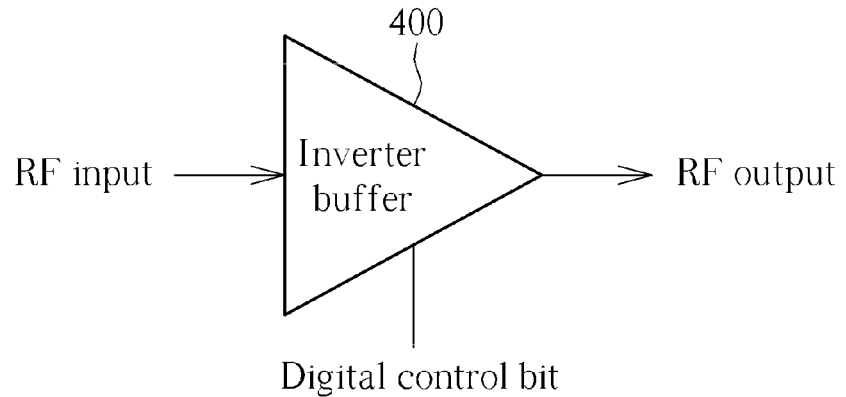
FIG. 4 is a diagram illustrating an inverter buffer according to an embodiment of the present invention.
Figure 5:
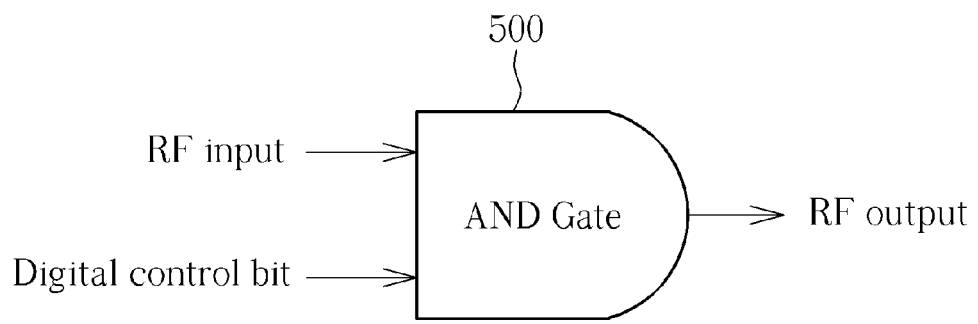
FIG. 5 is a diagram illustrating an AND gate according to an embodiment of the present invention.

The aforementioned DPA driver cell employed in the driver stage may be simply implemented using an inverter buffer 400, as shown in FIG. 4. The inverter buffer 400 is arranged to generate an RF output according to an RF input, where a digital control bit decides whether the inverter buffer 400 is enabled or disabled. Alternatively, the aforementioned DPA driver cell employed in the driver stage may be implemented using a logic gate, such as an AND gate 500 shown in FIG. 5. Therefore, the AND gate 500 generates an RF output by mixing an RF input and a digital control bit, where a logic gating operation is controlled by the digital control bit.

Figure 6:
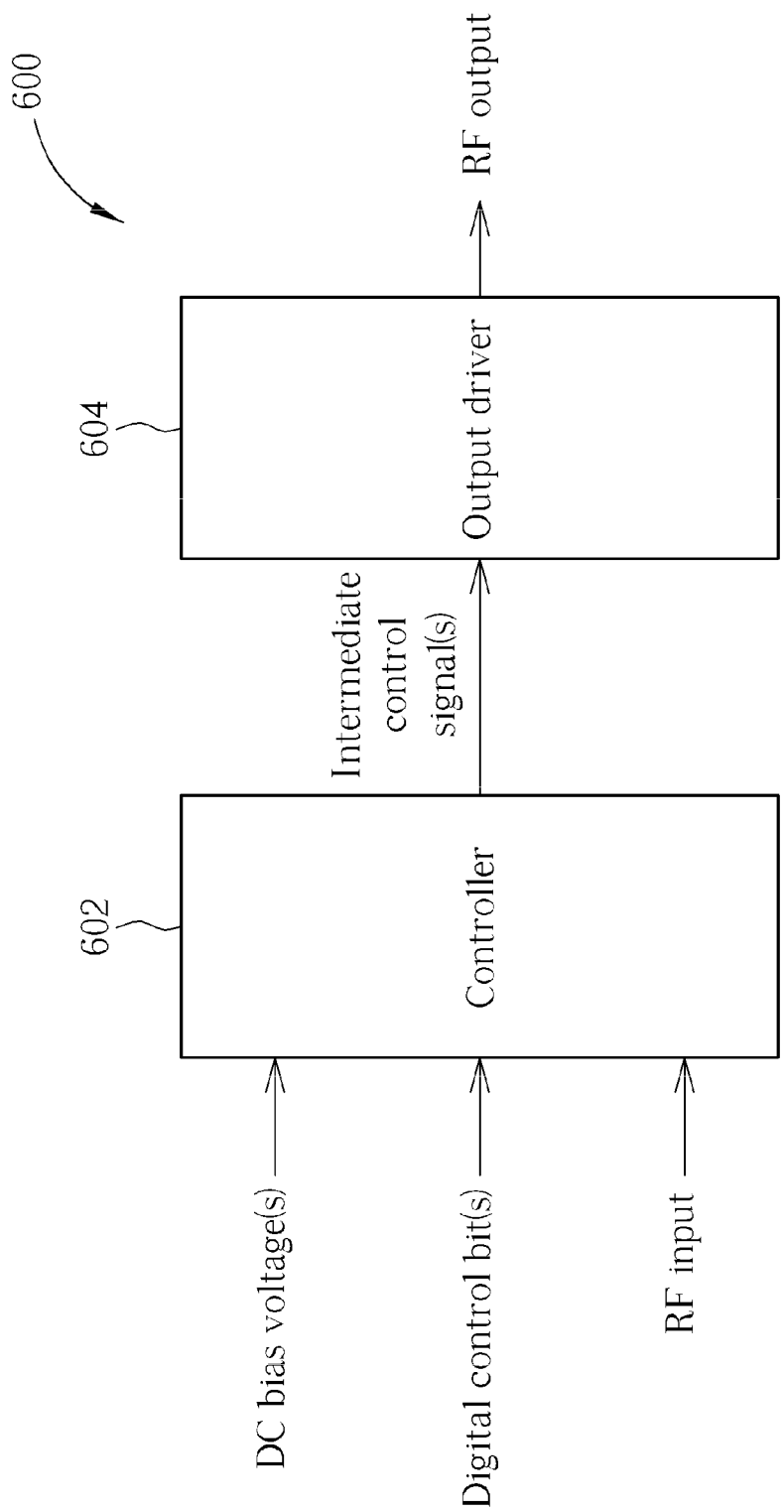
FIG. 6 is a diagram illustrating an output cell employed in an output stage of a multi-stage DPA according to an exemplary embodiment of the present invention.

The aforementioned DPA output cell employed in the output stage may be simply implemented using the inverter buffer 400 shown in FIG. 4. Therefore, the DPA output cell is directly controlled by the digital control bit. Alternatively, the DPA output cell may be indirectly controlled by the digital control bit. FIG. 6 is a diagram illustrating an output cell employed in an output stage of a multi-stage DPA according to an exemplary embodiment of the present invention. The output cell 600 includes a controller 602 and an output driver 604. The controller 602 receives one or more DC bias voltages, one or more digital control bits and an RF input, and generates one or more intermediate control signals to the following output driver 604 according to the actual design of the output driver 604. For example, the output driver 604 may be a class-D amplifier, including a P-type block with P-type transistor(s) and an N-type block with N-type transistor(s). Hence, the controller 602 is configured to generate intermediate controls signals to gate terminals of transistors employed in the output driver 604. The output driver 604 generates an RF output according to intermediate control signal(s).

The DPA driver cell/output cell may be configured in a single-ended topology to meet the requirement of a single-ended application. Alternately, the DPA driver cell/output cell may be configured in a differential topology to meet the requirement of a differential application.

Please note that the main concept of the present invention is to provide an innovative multi-stage arrangement of DPA cells, including driver cells in a driver stage and output cells in an output stage, rather than an implementation of the DPA cell. Any DPA cell design capable of achieving the desired functionality of the driver cell/output cell may be employed to realize the DPA cells employed in the multi-stage DPA 100/200/300. This also obeys the spirit of the present invention, and falls within the scope of the present invention.

By way of example, but not limitation, the proposed multi-stage DPA 100/200/300 may have one or all of the following features. Each stage is fully operated in a switching mode for highest efficiency. There is no DC level biasing needed. Each unit has a single RF input containing phase information only. Each unit has a single RF output containing phase and partial amplitude information.

Figure 7:
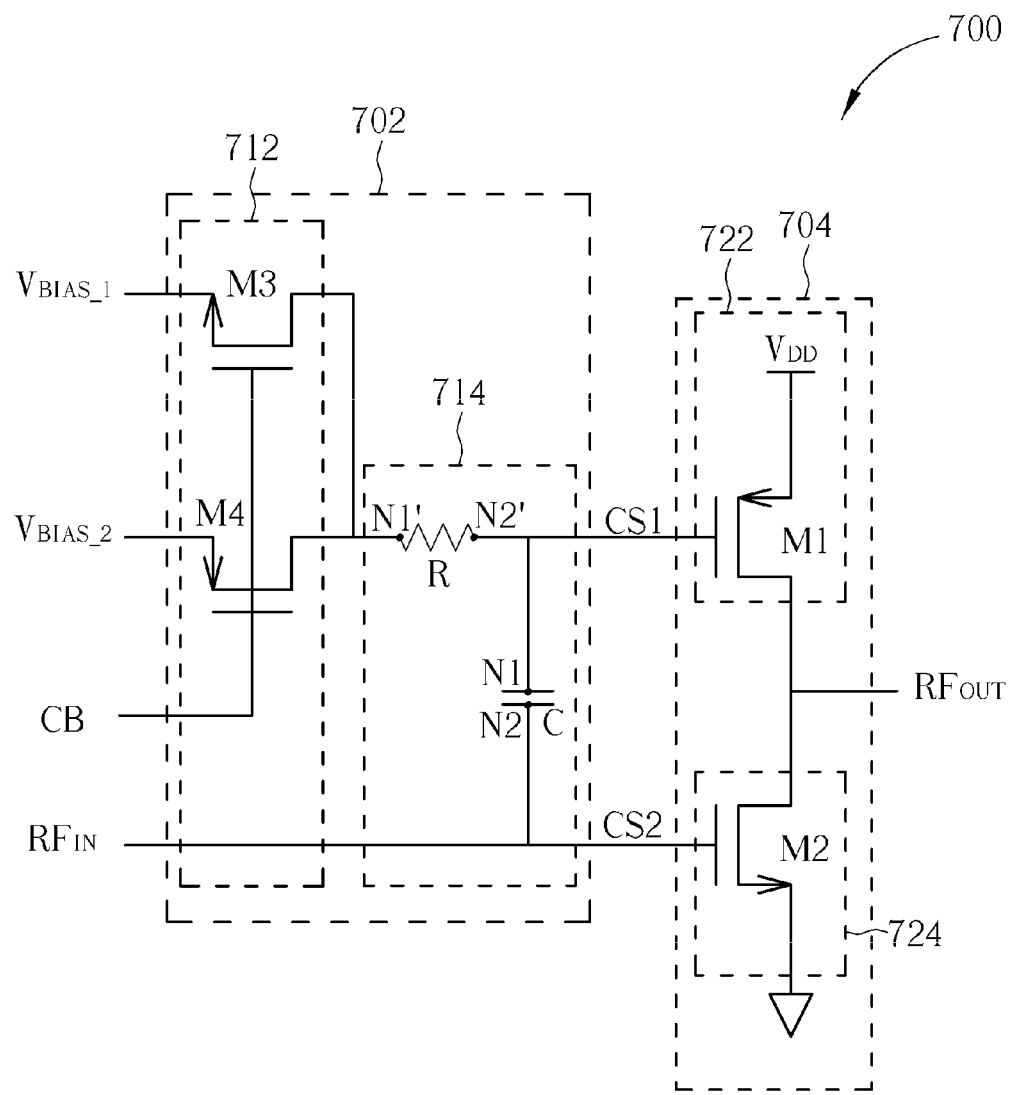
FIG. 7 is a diagram illustrating a first circuit implementation of the output cell shown in FIG. 6 according to an exemplary embodiment of the present invention.

Regarding the output cell 600 shown in FIG. 6, several circuit implementations are provided hereinafter for illustrative purposes. FIG. 7 is a diagram illustrating a first circuit implementation of the output cell 600 shown in FIG. 6 according to an exemplary embodiment of the present invention. The output cell 700 includes a controller 702 and an output buffer 704. The controller 702 is arranged for receiving a plurality of bias voltages $V_{BIAS\_1}$ and $V_{BIAS\_2}$, an RF input REIN, and a digital control bit CB (i.e., one bit of a digital ACW signal), and generating a plurality of intermediate control signals CS1 and CS2. In this embodiment, the controller 702 includes a control block 712 and a coupling block 714. The control block 712 is arranged for controlling the intermediate control signals CS1 and CS2 according to the bias voltages $V_{BIAS\_1}$ and $V_{BIAS\_2}$, the RF input $RF_{IN}$, and the digital control bit CB. The output driver 704 is arranged for generating an RF output $RF_{OUT}$ according to the intermediate control signals CS1 and CS2. In this embodiment, the output driver 704 has cascoded blocks 722 and 724, where the block 722 is a P-type block and the block 724 is an N-type block. The P-type block 722 has a P-type metal-oxide-semiconductor (MOS) transistor M1 responsive to the intermediate control signal CS1, and the N-type block M2 has an N-type MOS transistor M2 responsive to the intermediate control signal CS2.

Regarding the control block 712, it includes an N-type MOS transistor M3 and a P-type MOS transistor M4 both controlled by the digital control bit CB. For example, when the N-type MOS transistor M3 is enabled (i.e., switched on), the P-type MOS transistor M4 is disabled (i.e., switched off), and when the N-type MOS transistor M3 is disabled (i.e., switched off), the P-type MOS transistor M4 is enabled (i.e., switched on). As can be seen from FIG. 7, the DC bias voltage of the MOS transistor M1 is set by $V_{BIAS\_1}$ when the MOS transistor M3 is enabled by the digital control bit CB (i.e., CB='1'), and the DC bias voltage of the MOS transistor M1 is set by $V_{BIAS\_2}$ when the MOS transistor M4 is enabled by the digital control bit CB (i.e., CB='0'). Besides, the control block 712 directly transmits the RF input $RF_{IN}$ as the intermediate control signal CS2.

The coupling block 714 includes a capacitor C and a resistor R, where the capacitor C has a first end N1 coupled to gate of the P-type MOS transistor M1 and a second end N2 coupled to gate of the N-type MOS transistor M2, and the resistor R has a first end N1' coupled to the preceding control block 712 and a second end N2' coupled to the first end N1 of the capacitor C. The capacitor C is used for AC coupling such that AC signal components carried by the RF input $RF_{IN}$ is coupled to the gate of the MOS transistor M1. To put it another way, each of the intermediate control signals CS1 and CS2 would have AC signal components, and DC levels of the intermediate control signals CS1 and CS2 are different. For example, the DC level of the intermediate control signal CS2 may be 0.6V, whereas the DC level of the intermediate control signal CS1 is either $V_{BIAS\_1}$ or $V_{BIAS\_2}$.

As can be readily seen from FIG. 7, the output driver 704 is not inductor-loaded. Hence, no class-$D^{-1}$/class-E amplifier is employed in the output cell 700. By way of example, the output driver 704 is implemented using a class-D amplifier, thus avoiding the voltage swing problem encountered by the conventional class-$D^{-1}$/class-E DPA cell structure. Specifically, the voltage swing of the output cell 700 is limited within the $V_{DD}$ rail. The supply voltage $V_{DD}$ of the output cell 700 is therefore allowed to be increased to approach the nominal voltage value of the battery, which improves the battery efficiency accordingly. Besides, as the voltage swing of the output cell 700 is limited within the $V_{DD}$ rail, reliability of core devices and I/O devices are ensured.

Figure 8:
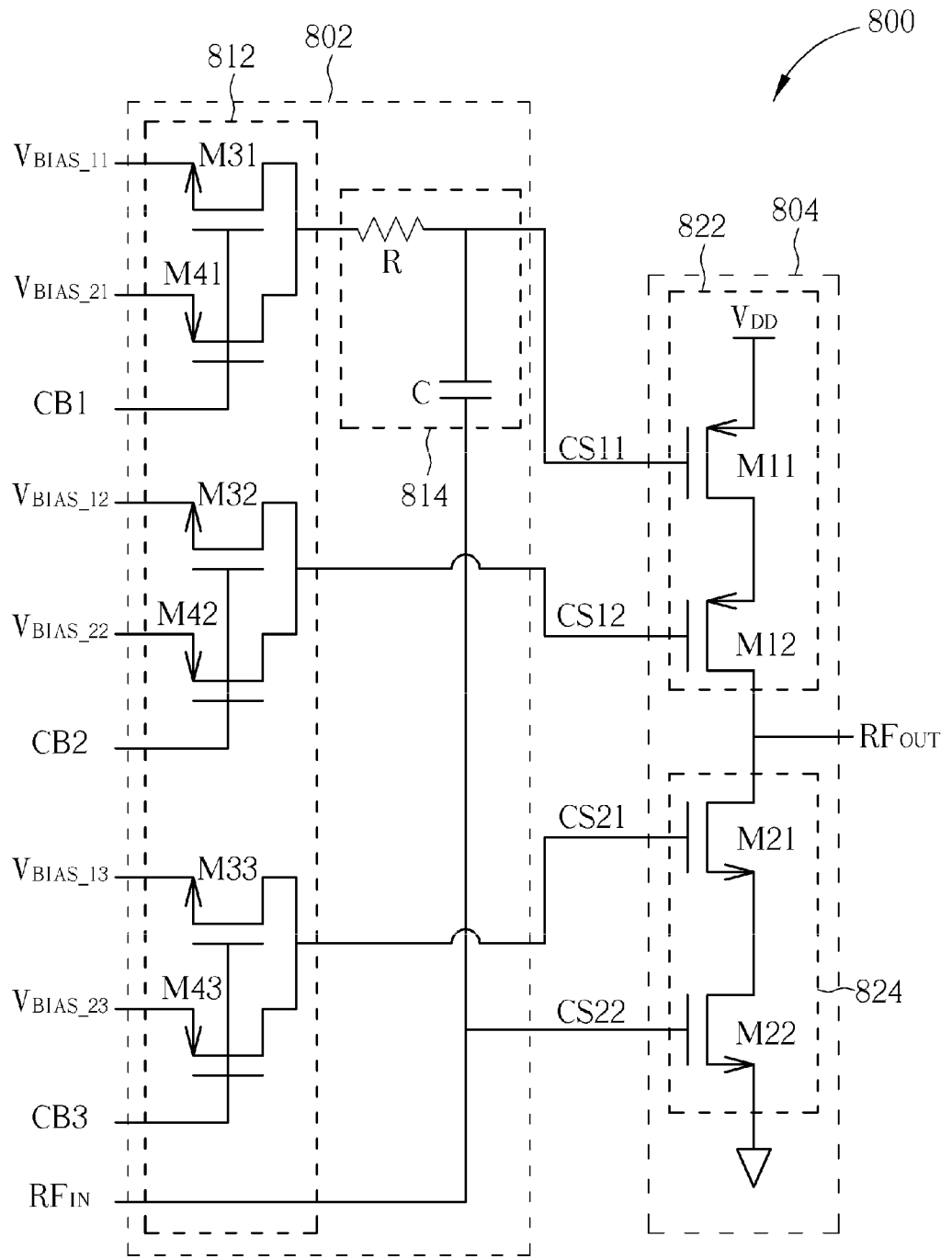
FIG. 8 is a diagram illustrating a second circuit implementation of the output cell shown in FIG. 6 according to an exemplary embodiment of the present invention.

The number of P-type MOS transistors included in the P-type block 722 shown in FIG. 7 and the number of N-type MOS transistors included in the N-type block 724 shown in FIG. 7 are for illustrative purposes. Using multiple intermediate control signals to control multiple inputs of the N-type block and/or the P-type block is possible. FIG. 8 is a diagram illustrating a second circuit implementation of the output cell 600 shown in FIG. 6 according to an exemplary embodiment of the present invention. The exemplary output cell 800 includes a controller 802 and an output buffer 804. The P-type block 822 has multiple P-type MOS transistors M11 and M12, and the N-type block 824 has multiple N-type MOS transistors M21 and M22. As each of the P-type block 822 and N-type block 824 has more than one MOS transistor, the controller 802 is therefore configured to provide multiple intermediate control signals CS11, CS12, CS21, CS22 to multiple inputs of the output driver 804. In this embodiment, the controller 802 includes a control block 812 and a coupling block 814. The coupling block 814 has a capacitor C coupled between gates of the MOS transistors M11 and M22, and a resistor R coupled between the preceding control block 812 and the following output driver 804. Regarding the control block 812, it includes a plurality of N-type MOS transistors M31, M32, M33 and a plurality of P-type MOS transistors M41, M42, M43, where MOS transistors M31 and M41 are controlled by a digital control bit CB1 to determine which one of the bias voltages $V_{BIAS\_11}$ and $V_{BIAS\_21}$ should be outputted to the following resistor R, MOS transistors M32 and M42 are controlled by a digital control bit CB2 to determine which one of the bias voltages $V_{BIAS\_12}$ and $V_{BIAS\_22}$ should be outputted as the intermediate control signal CS12, and MOS transistors M33 and M43 are controlled by a digital control bit CB3 to determine which one of the bias voltages $V_{BIAS\_13}$ and $V_{BIAS\_23}$ should be transmitted as the intermediate control signal CS21. Besides, the RF input RF_IN is directly transmitted as the intermediate control signal CS22. The same objective of avoiding the voltage swing problem is achieved as the output driver 804 is not an inductor-loaded class-$D^{-1}$/class-E amplifier.

It should be noted that the coupling block 714/814, including the resistor R and the capacitor C, may have impact on the intermediate control signal, thus affecting the transient waveform of the RF output $RF_{OUT}$. Please refer to FIG. 9, which is a diagram illustrating a time-domain waveform of a single bit operation of the output cell 700 shown in FIG. 7. The time-domain waveform has a negative exponential ramping up at the positive edge due to the RC circuit boot-strapping effect resulting from charging via the resistor R and the capacitor C, and has an abrupt shutdown at the negative edge due to the immediate shutdown of the MOS transistors M1 and M2. If the positive edge can also show an abrupt ramping up, an ideal zero-order-hold (ZOH) DAC behavior can be obtained. The present invention therefore proposes a solution which achieves the objective of setting the output cell 700 to have the ZOH DAC behavior by using a digitally-controlled charging technique such as a ZOH charging control.

Figure 10:
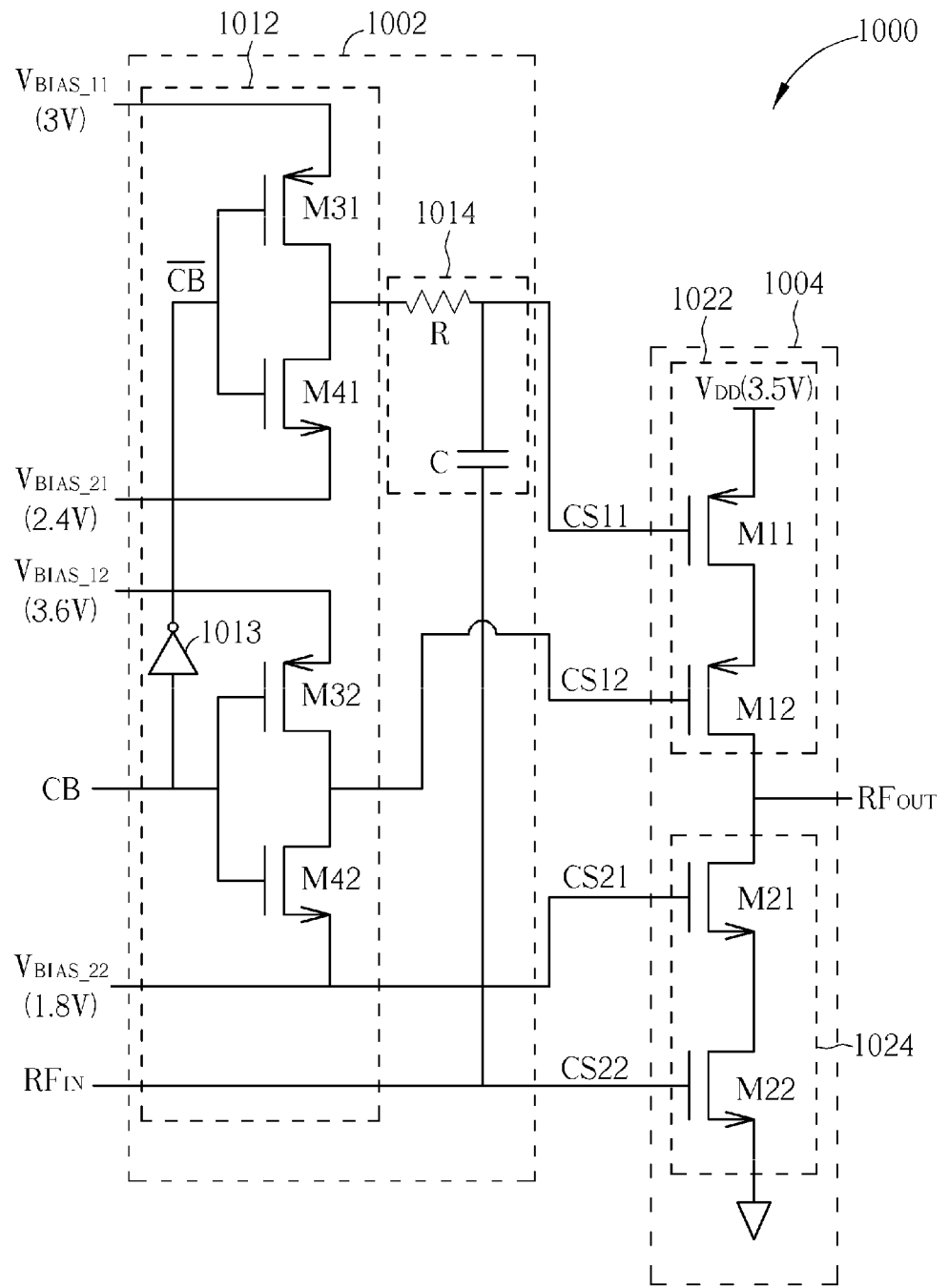
FIG. 10 is a diagram illustrating a third circuit implementation of the output cell shown in FIG. 6 according to an exemplary embodiment of the present invention.

FIG. 10 is a diagram illustrating a third circuit implementation of the output cell 600 shown in FIG. 6 according to an exemplary embodiment of the present invention. The exemplary output cell 1000 has a controller 1002 and an output driver 1004. The output driver 1004 operates under a supply voltage $V_{DD}$ (e.g., 3.5V), and generates an RF output $RF_{OUT}$ according to intermediate control signals CS11, CS12, CS21, CS22. The P-type block 1022 has cascoded P-type MOS transistors M11 and M12, and the N-type block 1024 has cascoded N-type MOS transistors M21 and M22. In this embodiment, the output cell 1000 realizes the transient waveform control by changing the circuitry and control sequence of the controller 1002. Specifically, the output cell 1000 is abruptly turned on and off in response to one bit of the digital ACW signal. Regarding the controller 1002, it includes a control block 1012 and a coupling block 1014. The coupling block 1014 has a resistor R and a capacitor C, where the desired abrupt turning on is performed through resistive charging of the capacitor C. Further details are described as below.

Regarding the control block 1012, it includes a plurality of P-type MOS transistors M31, M32 and a plurality of N-type MOS transistors M41, M42, where MOS transistors M32 and M42 are controlled by a digital control bit CB to determine which one of the bias voltages $V_{BIAS\_12}$ (e.g., 3.6V) and $V_{BIAS\_22}$ (e.g., 1.8V) should be outputted as the intermediate control signal CS12, and the MOS transistors M31 and M41 are controlled by an inverse version of the digital control bit CB (e.g., $\overline{CB}$ generated by an inverter 1013) to determine which one of the bias voltages $V_{BIAS\_11}$ (e.g., 3V) and $V_{BIAS\_22}$ (e.g., 2.4V) should be outputted to the following resistor R. Besides, the RF input $RF_{IN}$ is directly provided as the intermediate control signal CS22, and the bias voltage $V_{BIAS\_22}$ is directly provided as the intermediate control signal CS21. It should be noted that the high impedance 3V node (i.e., 3V supplied to source of the P-type MOS transistor M31) is necessary for clamping a DC voltage level from leakage discharging at the positive supply rail due to AC signal coupling.

Figure 11:
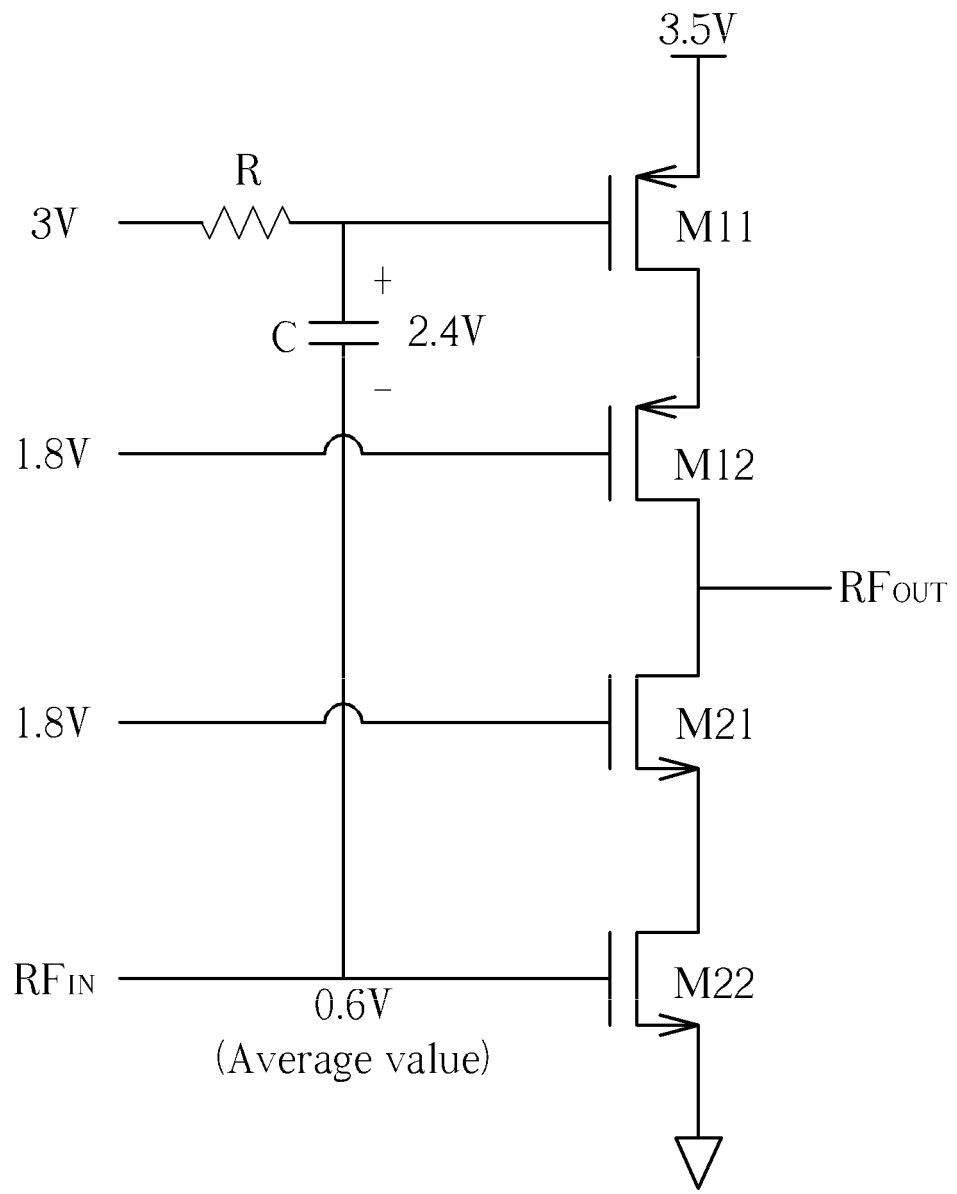
FIG. 11 is a diagram illustrating an equivalent circuit of the output driver shown in FIG. 10 that is operating in an ON state.
Figure 12:
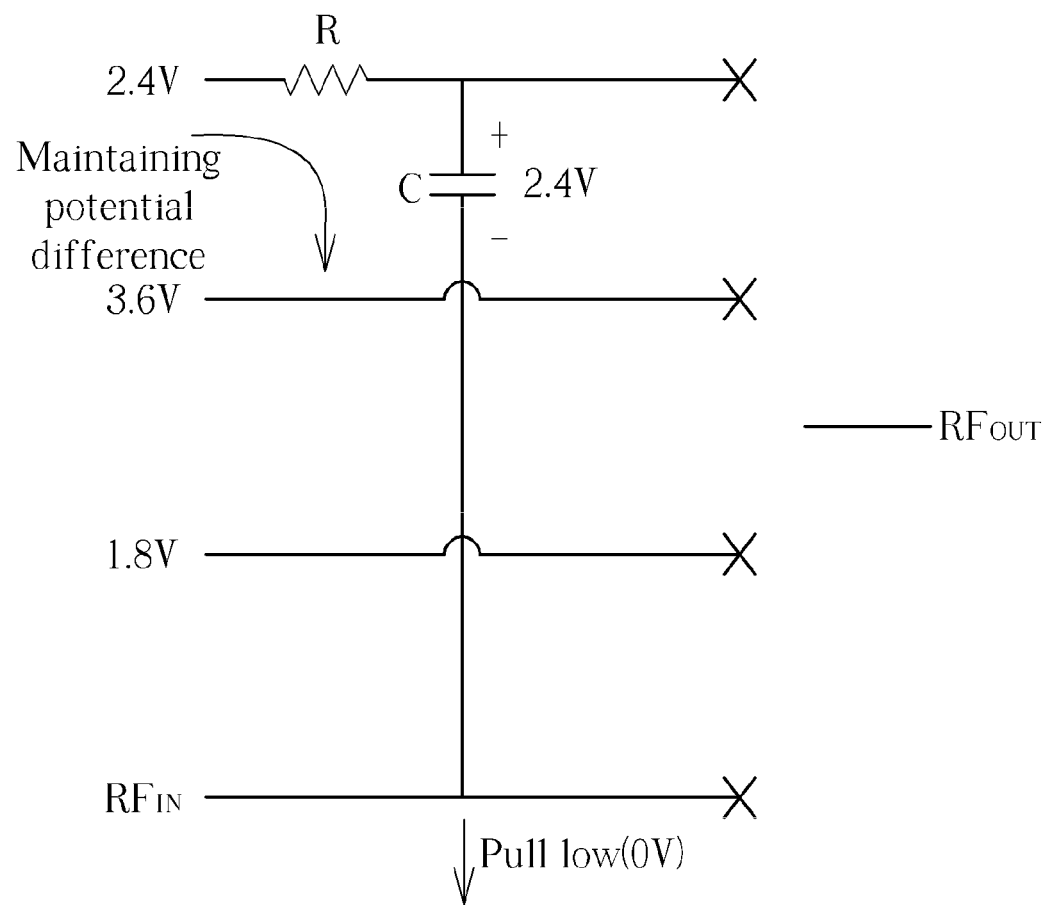
FIG. 12 is a diagram illustrating an equivalent circuit of the output driver shown in FIG. 10 that is operating in an OFF state.

The digital control bit CB controls the output driver 1004 to operate in either an ON state or an OFF state. When the digital control bit CB is logic high (i.e., CB='1'), the MOS transistors M31, M42, M11, M12, M21, M22 are enabled (i.e., switched on) and MOS transistors M41 and M32 are disabled (i.e., switched off), the output driver 1004 operates in the ON state. It should be noted that ON/OFF states of the MOS transistors M11, M12, M21, M22 may also be controlled by the RF input RF_IN. For example, when RF_IN=0, the MOS transistor M22 is off no matter what CB is. Please refer to FIG. 11, which is a diagram illustrating an equivalent circuit of the output driver 1004 operating in an ON state. Supposing the average value of the RF input $RF_{IN}$ is 0.6V resulting from the DC level toggling between 0V and 1.2V, the voltage across the AC coupling capacitor C is 2.4V. When the digital control bit CB is logic low (i.e., CB='0'), the MOS transistors M41 and M32 are enabled (i.e., switched on) and the MOS transistors M31, M42, M11, M12, M21, M22 are disabled (i.e., switched off), the output driver 1004 operates in the OFF state. Please refer to FIG. 12, which is a diagram illustrating an equivalent circuit of the output driver 1004 operating in an OFF state. When the output driver 1004 enters the OFF state, the controller 1002 is operative to maintain the potential difference of the capacitor C. As the bottom terminal of the capacitor C would be pulled low to 0V due to the RF input RF_IN gated off by earlier stages, a pre-charging voltage potential 2.4V is developed at the top terminal of the capacitor C. As can be readily seen from FIG. 11 and FIG. 12, no matter whether the output driver 1004 is operating in the ON state or the OFF state, the voltage across the capacitor C is fixed at 2.4V. When the digital control bit CB has a transition from '0' to '1', the output driver 1004 would leave the OFF state and enters the ON state. As the bottom terminal of the capacitor C would be increased to the average value of the RF input $RF_{IN}$ (e.g., 0.6V), the top terminal of the capacitor C would be correspondingly boosted to 3.0V (e.g., 2.4V+0.6V), which is identical to the desired DC bias level needed under the ON state. In this way, the RC boot-strapping effect resulting from charging via the resistor R and the capacitor C is avoided.

Figure 13:
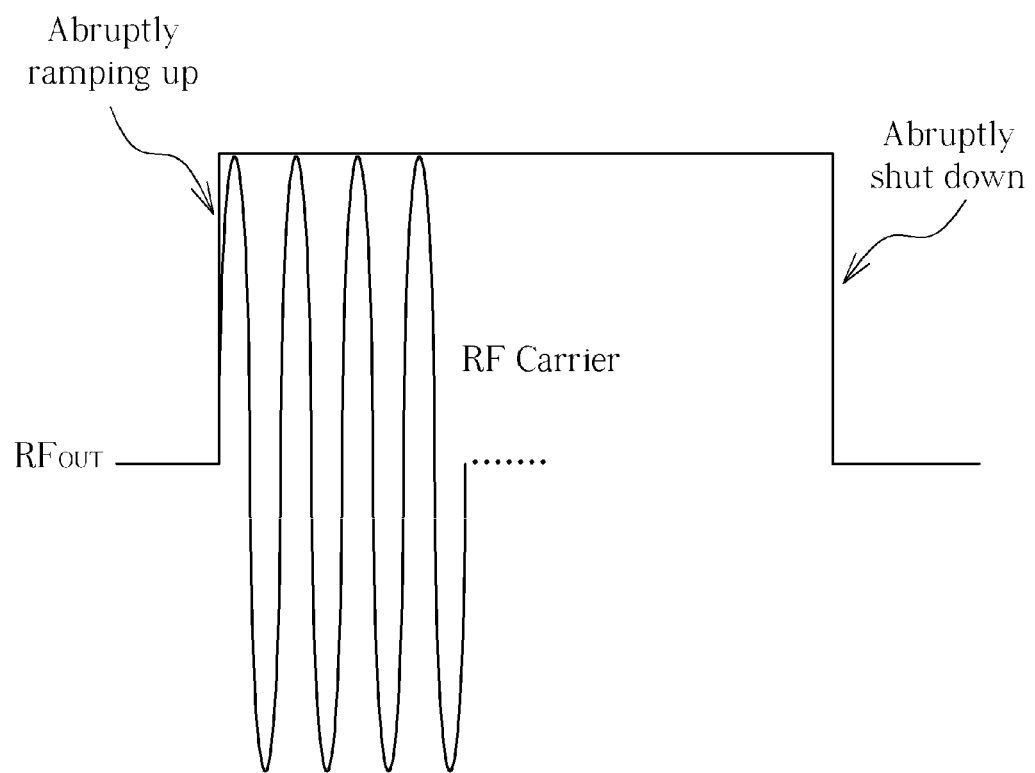
FIG. 13 is a diagram illustrating a time-domain waveform of a single bit operation of the output cell shown in FIG. 10.

FIG. 13 is a diagram illustrating a time-domain waveform of a single bit operation of the output cell 1000 shown in FIG. 10. As a potential difference maintenance phase for the AC coupling capacitor C is added during the OFF state to eliminate the long transient settling resulting from the RC boot-strapping effect, the output cell 1000 is abruptly turned on and off in response to the digital control bit CB (i.e., one bit of the digital ACW signal). Hence, with a proper change of the controller circuitry as well as related control sequence, the output cell 1000 may have an ideal ZOH DAC behavior as shown in FIG. 13.

It should be noted that the proposed ZOH capacitor charging control technique is not limited to the DPA cell design shown in FIG. 10. For example, the proposed ZOH capacitor charging control technique may be applied to any of the output cells 700 and 800 for transient waveform control. These alternative designs all fall within the scope of the present invention.

Figure 9:
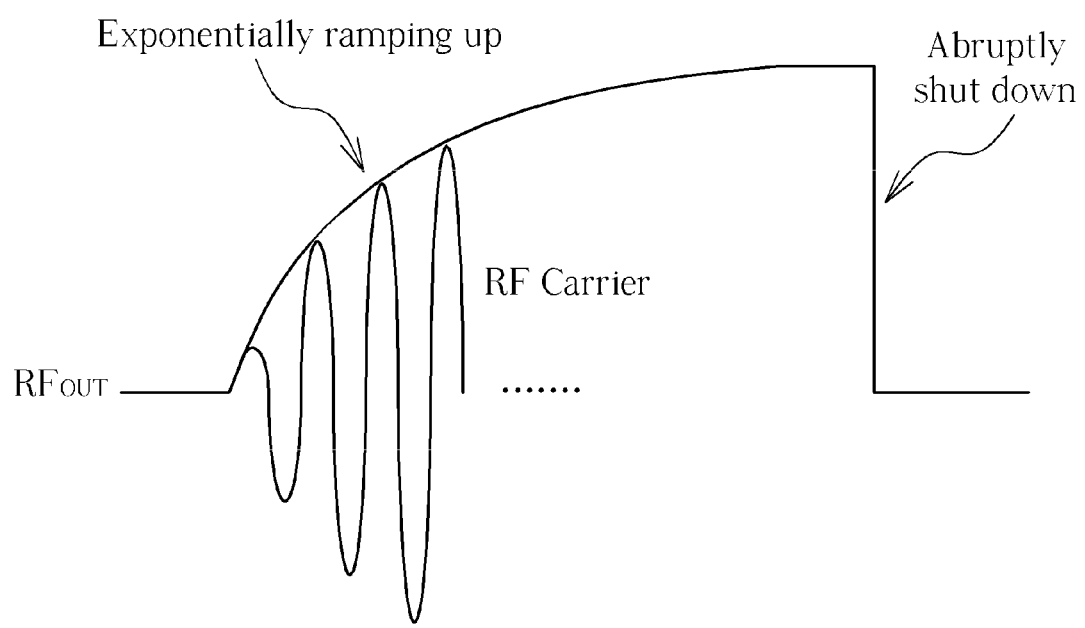
FIG. 9 is a diagram illustrating a time-domain waveform of a single bit operation of the output cell shown in FIG. 7.

As shown in FIG. 9, the time-domain waveform has a negative exponential ramping up at the positive edge due to the RC boot-strapping effect, and has an abrupt shutdown at the negative edge due to the immediate shutdown of the MOS transistors M1 and M2. If the negative edge can also show a corresponding exponential ramping down, the one-bit pulse is roughly equivalently $1^{st}$ order low-pass filtered at the baseband or bandpass filtered at the RF carrier. That is, reduction of the out-of-band (OOB) noise/replica may be achieved when the output cell is capable of generating a one-bit pulse having a negative exponential ramping up at the positive edge and a corresponding negative exponential ramping down at the negative edge. The present invention proposes a solution which achieves the objective by using a digitally-controlled charging technique such as an RC-interpolation charging control.

Figure 14:
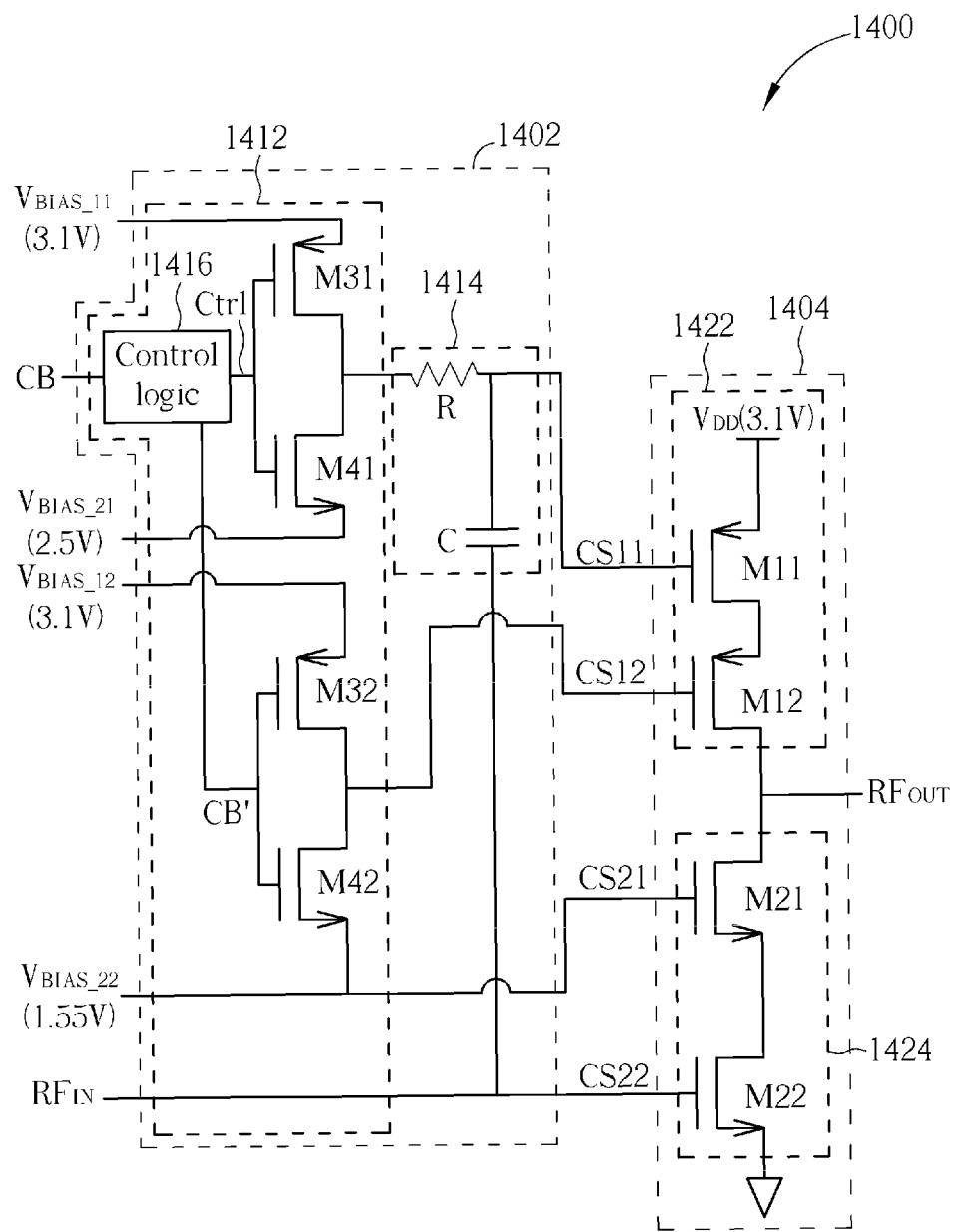
FIG. 14 is a diagram illustrating a fourth circuit implementation of the output cell shown in FIG. 6 according to an exemplary embodiment of the present invention.

FIG. 14 is a diagram illustrating a fourth circuit implementation of the output cell 600 shown in FIG. 6 according to an exemplary embodiment of the present invention. The exemplary output cell 1400 has a controller 1402 and an output driver 1404. The output driver 1404 operates under a supply voltage $V_{DD}$ (e.g., 3.1V), and generates an RF output $RF_{OUT}$ according to intermediate control signals CS11, CS12, CS21, CS22. The P-type block 1422 has cascoded P-type MOS transistors M11 and M12, and the N-type block 1424 has cascoded N-type MOS transistors M21 and M22. In this embodiment, the output cell 1400 realizes the RF bandpass filtering by changing the circuitry and control sequence of the controller 1402. Specifically, the output cell 1400 is gradually turned on and off in response to one bit of the digital ACW signal (i.e., a digital control bit CB). Regarding the controller 1402, it includes a control block 1412 and a coupling block 1414. The coupling block 1414 has a resistor R and a capacitor C, where the desired gradual turning on and off is performed through resistive pre-charging of the capacitor C. Further details are described as below.

Figure 15:
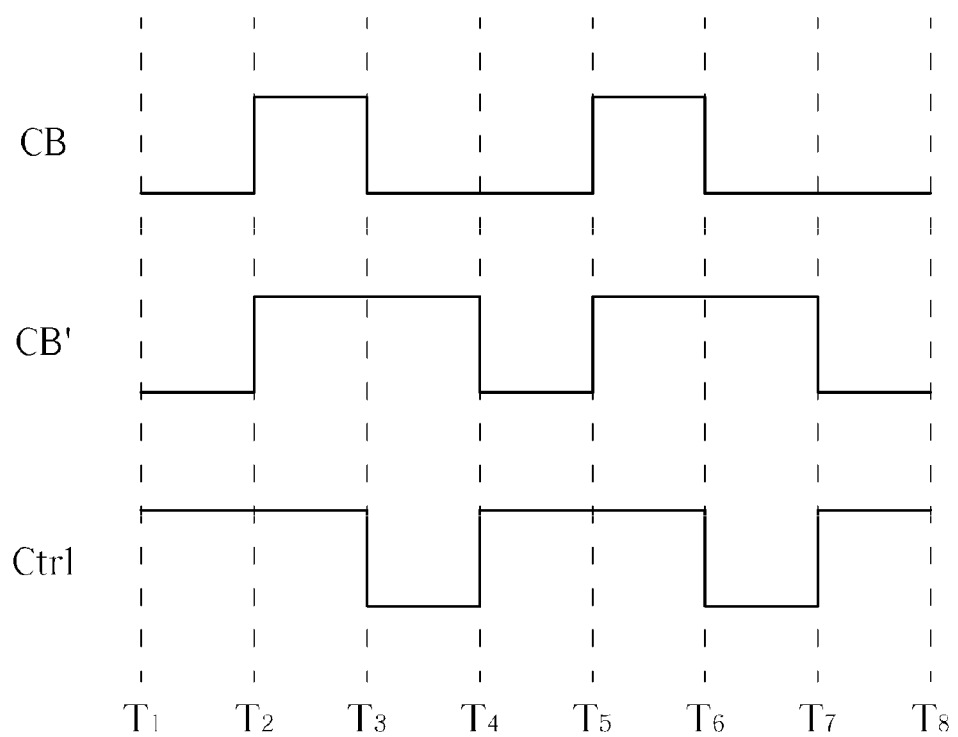
FIG. 15 is a waveform diagram of the digital control bit and the control outputs according to an exemplary embodiment of the present invention.

Regarding the control block 1412, it includes a control logic 1416, a plurality of P-type MOS transistors M31, M32 and a plurality of N-type MOS transistors M41, M42. The control logic 1416 is arranged to generate a plurality of control outputs Ctrl and CB' according to a digital control bit CB (e.g., one bit of a digital ACW signal). Please refer to FIG. 15, which is a waveform diagram of the digital control bit CB and the control outputs CB' and Ctrl according to an exemplary embodiment of the present invention. In one exemplary design, the control output CB' may be derived from delaying the transition from a logic high level to a logic low level of the digital control bit CB. Hence, compared to the digital control bit CB, the control output CB' has extended logic-high periods. Regarding the control signal Ctrl, it may be derived from delaying an inverse version of the digital control bit CB. However, this is for illustrative purposes only, and is not meant to be a limitation of the present invention.

The MOS transistors M32 and M42 are controlled by the control output CB' to determine which one of the bias voltages $V_{BIAS\_12}$ (e.g., 3.1V) and $V_{BIAS\_22}$ (e.g., 1.55V) should be outputted as the intermediate control signal CS12. The MOS transistors M31 and M41 are controlled by the control output Ctrl to determine which one of the bias voltages $V_{BIAS\_11}$ (e.g., 3.1V) and $V_{BIAS\_21}$ (e.g., 2.5V) should be outputted to the following resistor R. Besides, the RF input REIN is directly transmitted as the intermediate control signal CS22, and the bias voltage $V_{BIAS\_22}$ is directly transmitted as the intermediate control signal CS21.

Figure 16:
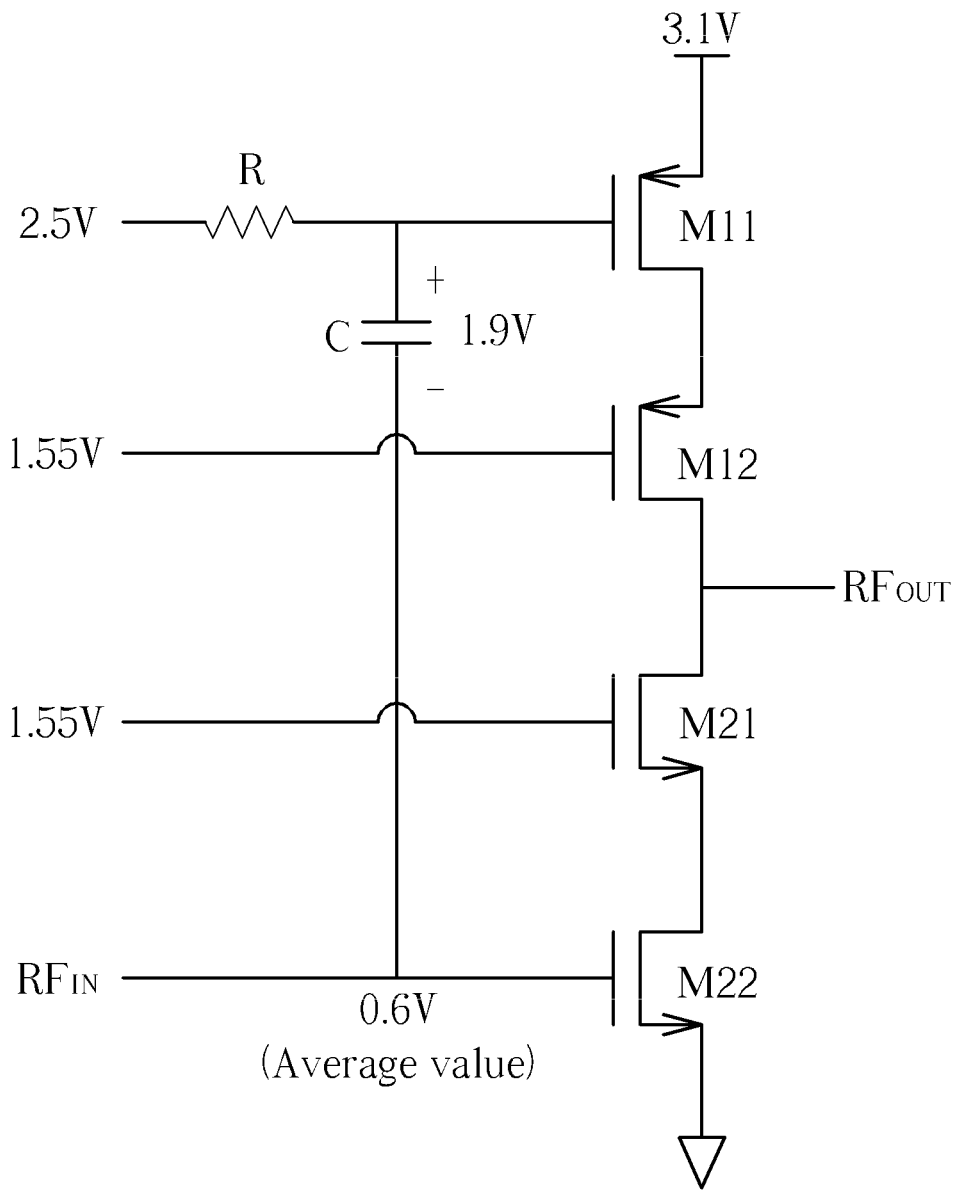
FIG. 16 is a diagram illustrating an equivalent circuit of the output driver shown in FIG. 14 that is operating in an ON state.

The control outputs Ctrl and CB' control the output driver 1404 to operate in an ON state, a pre-charging stage or an OFF state. When the control output CB' is logic high (i.e., CB'='1'') and the control output Ctrl is also logic high (i.e., Ctrl='1') during the period between $T_2$ and $T_3$, the MOS transistors M41, M42, M11, M12, M21, M22 are enabled (i.e., switched on) and MOS transistors M31 and M32 are disabled (i.e., switched off), the output driver 1404 operates in the ON state as shown in FIG. 16, which is a diagram illustrating an equivalent circuit of the output driver 1404 operating in an ON state.

Figure 17:
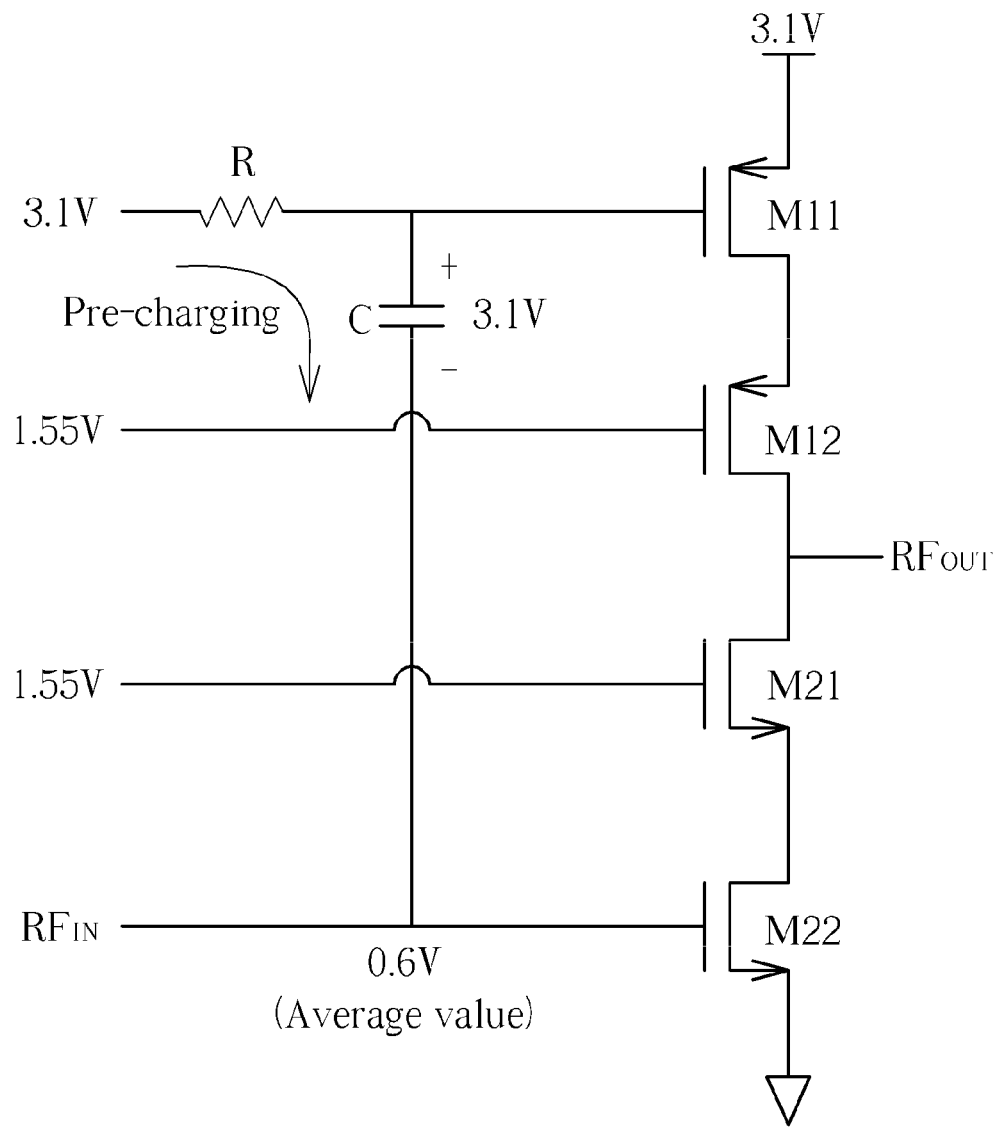
FIG. 17 is a diagram illustrating an equivalent circuit of the output driver shown in FIG. 14 that is operating in a pre-charging state.

When the control output CB' is logic high (i.e., CB'='1'') and the control output Ctrl is logic low (i.e., Ctrl='0'), the MOS transistors M31, M42, M11, M12, M21, M22 are enabled (i.e., switched on) and the MOS transistors M41, M32 are disabled (i.e., switched off) during the period between $T_3$ and $T_4$, the output driver 1404 operates in the pre-charging state. Specifically, when a negative edge of the digital control bit CB is indicative of an ON-to-OFF state transition of the output driver 1404 at $T_3$, the control block 1412 is operative to delay the ON-to-OFF state transition and pre-charge the capacitor C concurrently. Please refer to FIG. 17, which is a diagram illustrating an equivalent circuit of the output driver 1404 operating in a pre-charging state. When the output driver 1404 enters the pre-charging state, the controller 1402 is operative to pre-charge the capacitor C. It should be noted that the bottom terminal of the capacitor C is not pulled low to 0V right away, otherwise the abrupt shutdown causes no slow transient at the ON-to-OFF transition. The pre-charging voltage 3.1V is intentionally supplied to the capacitor C, thereby allowing the output driver 1404 to have an exponential RC behavior at the negative edge.

Figure 18:
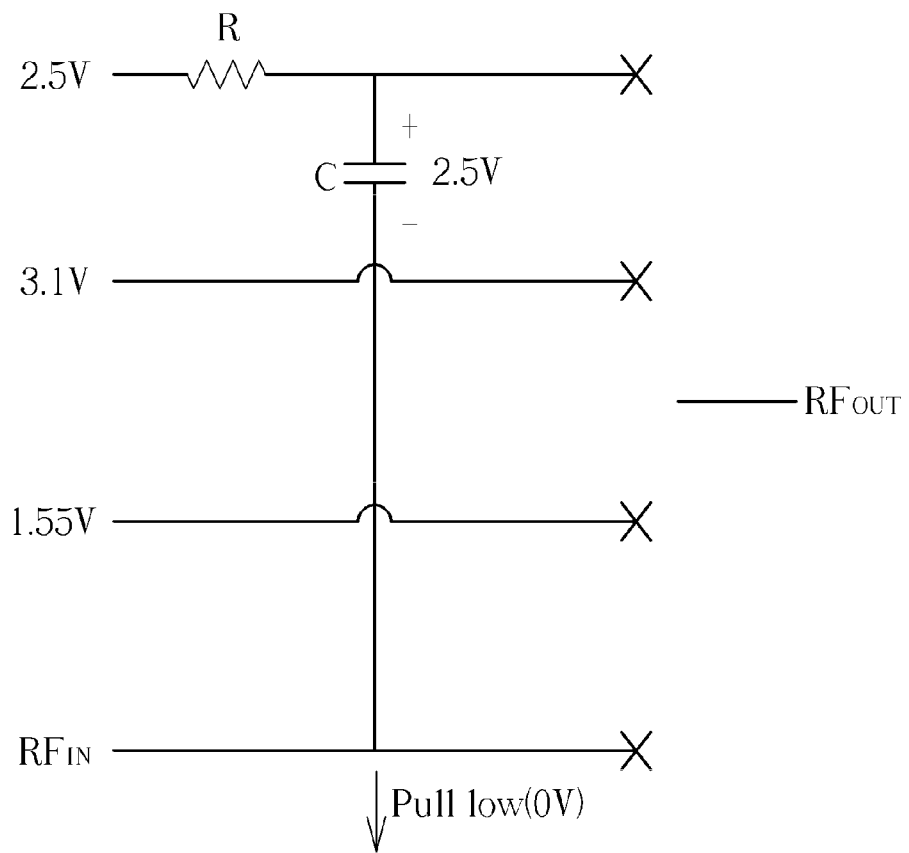
FIG. 18 is a diagram illustrating an equivalent circuit of the output driver shown in FIG. 14 that is operating in an OFF state.

When the control output CB' is logic low (i.e., CB'='0") and the control output Ctrl is logic high (i.e., Ctrl='1'), the MOS transistors M32, M41 are enabled (i.e., switched on) and the MOS transistors M31, M42, M11, M12, M21, M22 are disabled (i.e., switched off) during the period between $T_4$ and $T_5$, the output driver 1404 operates in the OFF state. Specifically, when the control output CB' has a transition from '1' to '0' and the control output Ctrl has a transition from '0' to '1', the output driver 1004 would leave the pre-charging state and enters the OFF state and the bottom terminal of the capacitor C would be pulled low to 0V as shown in FIG. 18, which is a diagram illustrating an equivalent circuit of the output driver 1404 operating in an OFF state.

Figure 19:
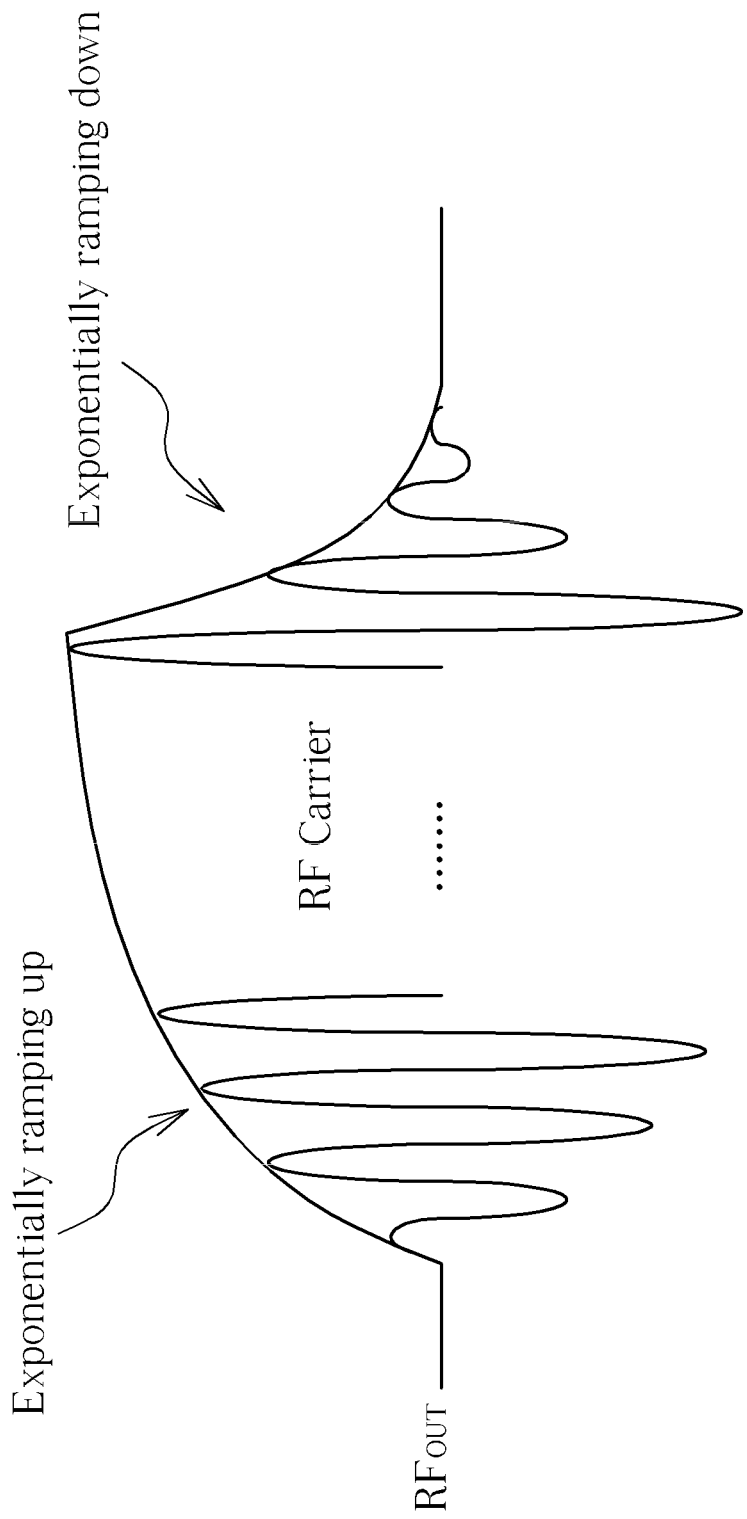
FIG. 19 is a diagram illustrating a time-domain waveform of a single bit operation of the output cell shown in FIG. 14.

FIG. 19 is a diagram illustrating a time-domain waveform of a single bit operation of the output cell 1400 shown in FIG. 14. As the shutdown operation is delayed due to a pre-charging state inserted between the ON state and the OFF state, the negative exponential RC ramping down is allowed to occur at the negative edge. In this way, the output cell 1400 is gradually turned on and off in response to the digital control bit CB (i.e., one bit of the digital ACW signal). Hence, with a proper change of the controller circuitry as well as control sequence, the output cell 1400 having bandpass filtering is realized. The output cell 1400 may achieve maximum available efficiency of the battery and reduces the OOB noise floor for multi-radio coexistence.

It should be noted that the proposed RC-interpolation charging control technique is not limited to the DPA cell design shown in FIG. 14. For example, the proposed RC-interpolation charging control technique may be applied to any of the output cells 700 and 800 for transient waveform control. These alternative designs all fall within the scope of the present invention.

The exemplary DPA output stage cell mentioned above may be employed for implementing the output stage 208 in the proposed multi-stage DPA 200/300. However, this is not meant to be a limitation of the present invention. Any DPA design using the exemplary DPA output stage cell mentioned above falls within the scope of the present invention.

Furthermore, the exemplary DPA output stage cell mentioned above may be used in a DPA coupled to a jointed transmission/reception (T/R) RF port. For example, the output signal RF_OUT shown in FIG. 2/FIG. 3 is directly coupled to a balun. In the transmitting mode, the limited voltage rail-to-rail swing ensures that transmitter device and receiver devices are ensured to be reliable for all allowable battery voltage levels. Hence, the proposed battery-efficient design can be realized without any constraint on circuit reliability. In the receiving mode, the DPA is turned off through gates of cascoded MOS transistors in each output cell. High balun Z-transformation ratio increases the matching gain of the low-noise amplifier (LNA), resulting in high voltage gain, low noise figure (NF), and low power consumption. To put it simply, the proposed DPA design has several advantages/benefits, such as limited voltage rail-to-rail swing and higher load-line impedance. The limited voltage rail-to-rail swing ensures the reliability of core devices and I/O devices. The higher load-line impedance allows smaller transistor sizes, which reduces driven load. Thus, the current consumption of the driver stage may be highly reduced while maintaining the phase noise requirements.

Figure 20:
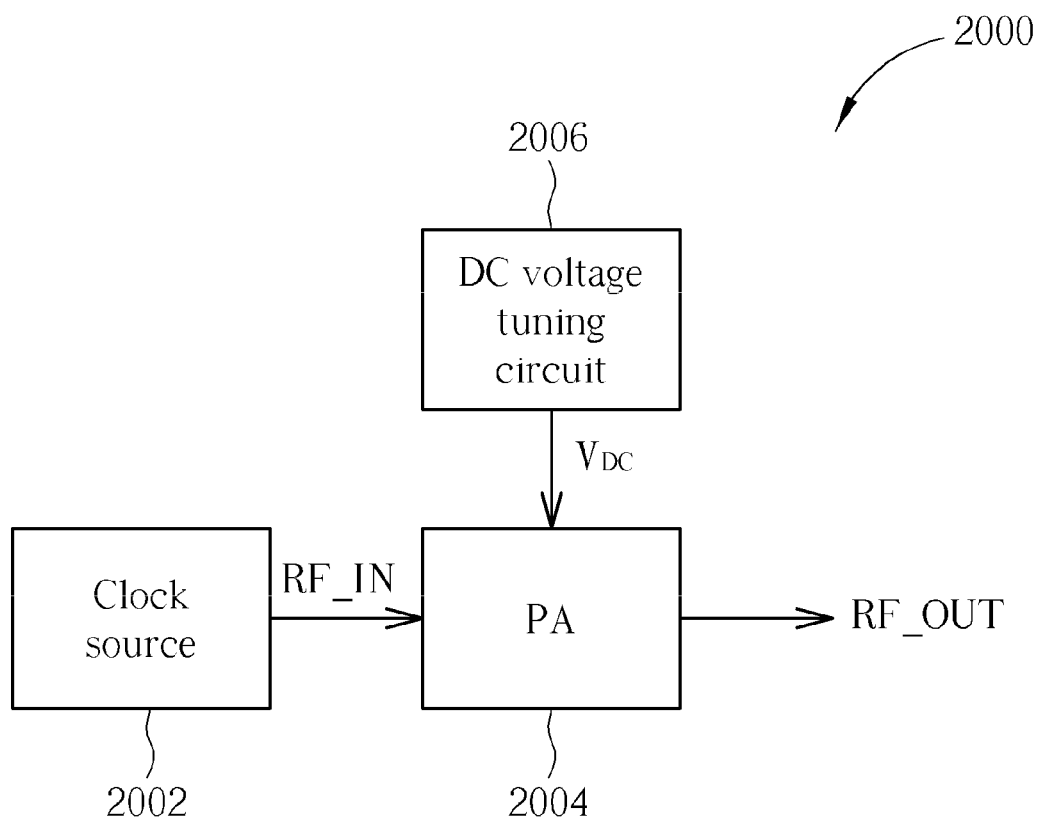
FIG. 20 is a diagram illustrating a transmitter employing an exemplary pulling mitigation mechanism according to an embodiment of the present invention.

Due to the feedback path established by magnetic coupling and/or direct coupling (e.g., coupling via the printed circuit board (PCB) ground and/or the package ground), the transmitter output may be fed back to a clock source in the transmitter, which may degrade the transmitter performance. Thus, there is a need for a pulling mitigation mechanism employed to improve the transmitter performance. FIG. 20 is a diagram illustrating a transmitter employing an exemplary pulling mitigation mechanism according to an embodiment of the present invention. The transmitter 2000 includes a clock source 2002, a power amplifier (PA) 2004, and a direct current (DC) voltage tuning circuit 2006. The PA 2004 is arranged for receiving a radio-frequency (RF) clock RF_IN derived from the clock source 2002, and producing an output signal RF_OUT according to at least the RF clock RF_IN. By way of example, but not limitation, the clock source 2002 may include a local oscillator (LO) such as a digitally controlled oscillator (DCO). The DC voltage tuning circuit 2006 is arranged for tuning at least one DC voltage $V_{DC}$ supplied to the PA 2004 for pulling mitigation of the clock source 2002. Specifically, the phase of the output signal RF_OUT is adjusted in response to the at least one DC voltage $V_{DC}$ tuned by the DC voltage tuning circuit 2006. In this way, the undesired pulling of the clock source 2002 can be mitigated by applying phase tuning upon the feedback loop from the transmitter output (i.e., the output signal RF_OUT of the PA 2004) to the clock source 2002. By way of example, but not limitation, the at least one DC voltage $V_{DC}$ may include a supply voltage or a bias voltage.

Figure 21:
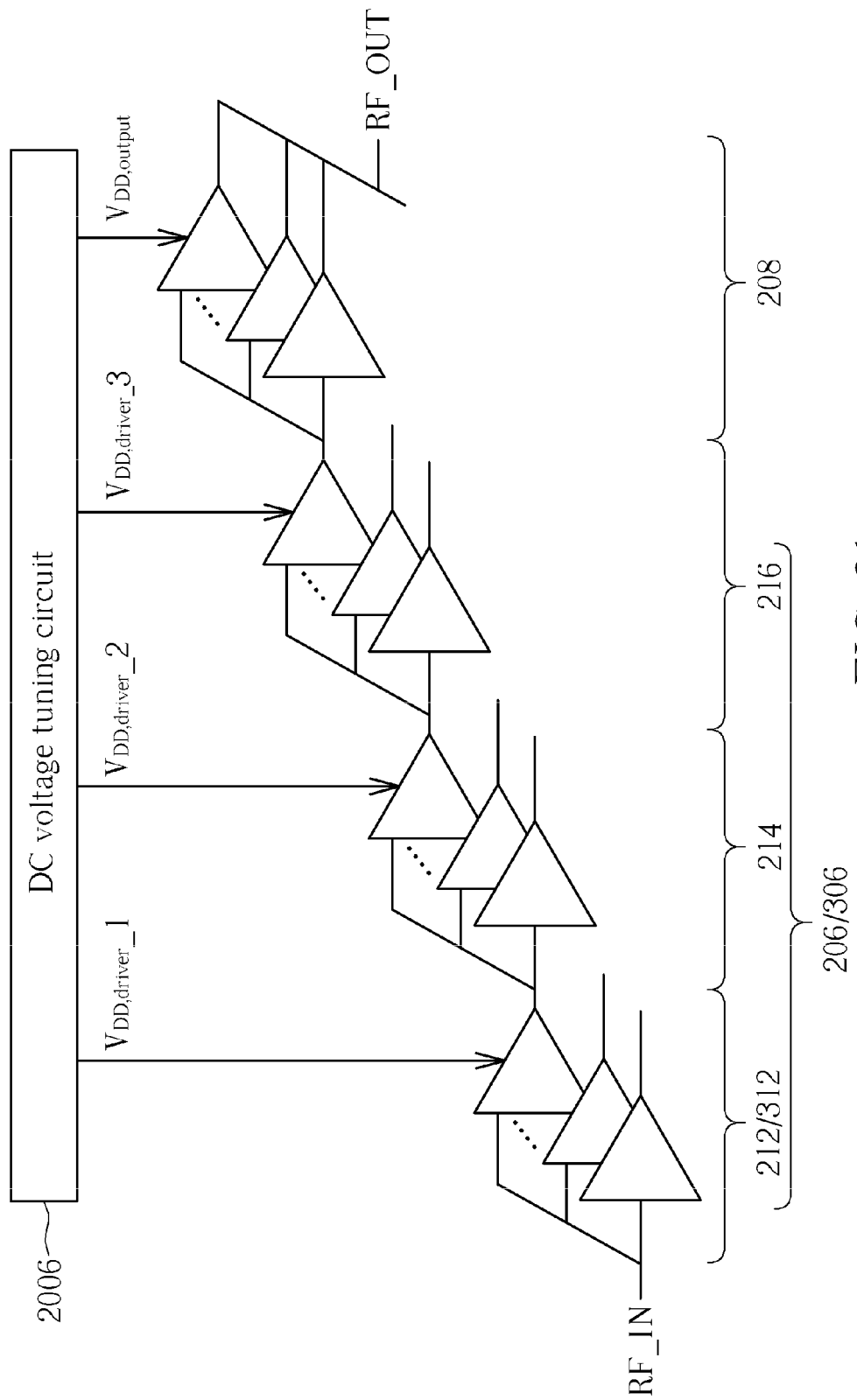
FIG. 21 is a diagram illustrating a multi-stage DPA with supply voltages tuned by a DC voltage tuning circuit for pulling mitigation of a clock source.

The proposed pulling mitigation mechanism may be applied to the above-mentioned multi-stage DPA. In one exemplary design, the PA 2004 shown in FIG. 20 includes a DPA such as the exemplary multi-stage DPA 100/200/300, and the at least one DC voltage $V_{DC}$ includes supply voltage(s) of the driver stage 106/206/306 and/or the output stage 108/208. FIG. 21 is a diagram illustrating a multi-stage DPA with supply voltages tuned by a DC voltage tuning circuit for pulling mitigation of a clock source (e.g., a DCO). As shown in FIG. 21, the aforementioned multi-stage DPA 200/300 is modified to have supply voltage(s) tuned by the DC voltage tuning circuit 2006, where a first driver-stage supply voltage $V_{DD,driver\_1}$ is supplied to drivers in the first cascaded stage 212/312 of the driver stage 206/306, a second driver-stage supply voltage $V_{DD,driver\_2}$ is supplied to drivers in the second cascaded stage 214 of the driver stage 206/306, a third driver-stage supply voltage $V_{DD,driver\_3}$ is supplied to drivers in the third cascaded stage 216 of the driver stage 206/306, and an output-stage supply voltage $V_{DD,output}$ is supplied to output cells in the output stage 208. It should be noted that driver-stage supply voltages $V_{DD,driver\_1}$-$V_{DD,driver\_3}$ and output-stage supply voltage $V_{DD,output}$ may have the same DC voltage level or different DC voltage levels.

In this example, all of the cells in the multi-stage DPA 200/300 are reused for feedback phase control via propagational delay adjustment. However, this is for illustrative purposes only, and is not meant to be a limitation of the present invention. In other words, the same objective of controlling the phase of the output signal RF_OUT for clock source pulling mitigation may be achieved by tuning supply voltage of at least one of the stages 212/312, 214, 216, and 208.

As mentioned above, the phase of the output signal RF_OUT dominates the pulling mitigation performance.

With a proper setting of the at least one DC voltage $V_{DC}$ supplied to the PA 2004, the pulling mitigation of the clock source 2002 may be optimized by optimally setting the aggressing phase generated by the PA versus the victim phase. The present invention therefore proposes adding a calibration element to the proposed pulling mitigation mechanism. Alternative designs of the transmitter 2000 shown in FIG. 20 are described as below.

Figure 22:
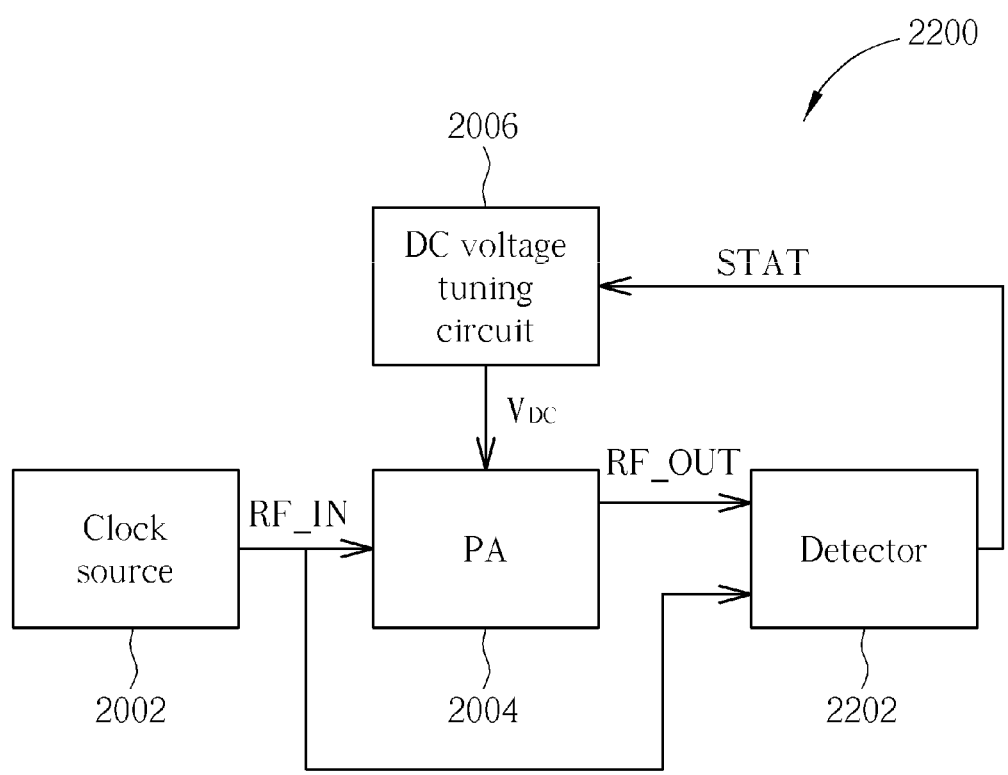
FIG. 22 is a diagram illustrating a transmitter employing another exemplary pulling mitigation mechanism according to an embodiment of the present invention.

FIG. 22 is a diagram illustrating a transmitter employing another exemplary pulling mitigation mechanism according to an embodiment of the present invention. The transmitter 2200 includes a detector 2202 and the aforementioned clock source 2002, PA 2004 and DC voltage tuning circuit 2006. The detector 2202 is operable of producing a statistic STAT of a delay (or the phase) between the RF clock RF_IN and the output signal RF_OUT. The DC voltage tuning circuit 2006 refers to the statistic STAT to adjust the at least one DC voltage $V_{DC}$.

Figure 23:
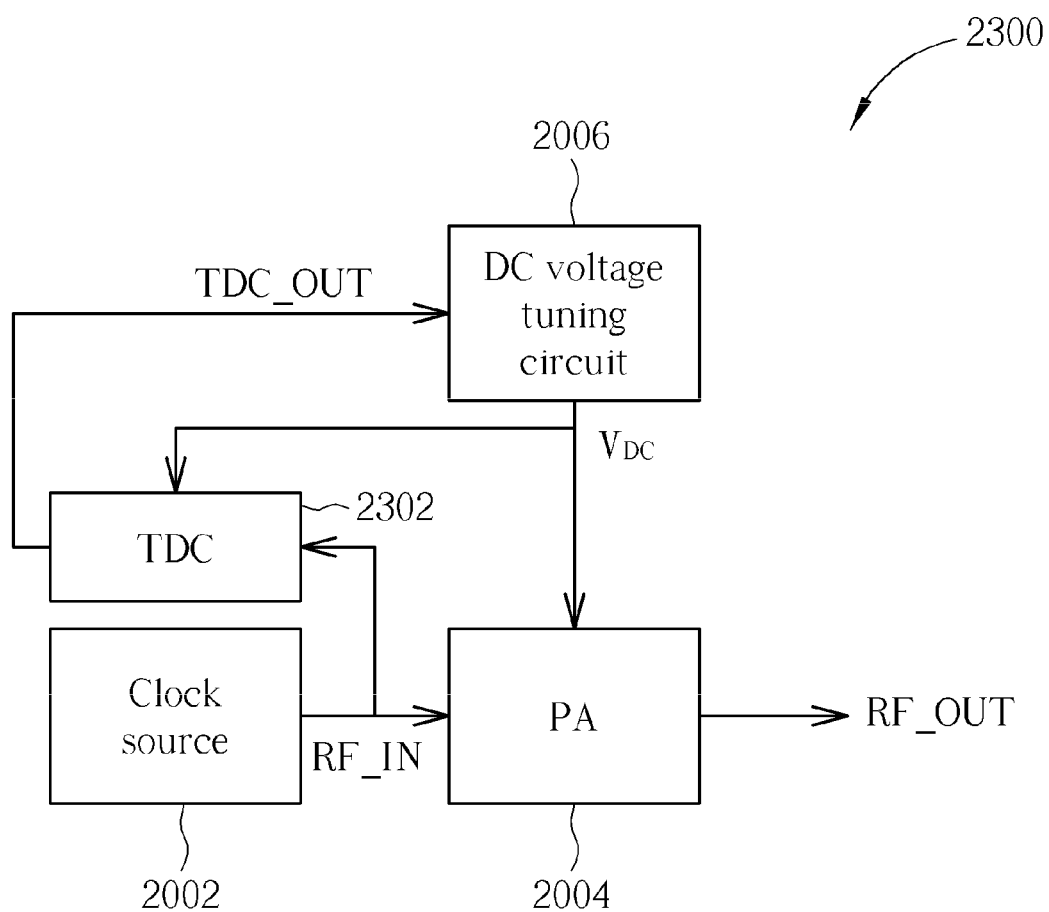
FIG. 23 is a diagram illustrating a transmitter employing yet another exemplary pulling mitigation mechanism according to an embodiment of the present invention.

FIG. 23 is a diagram illustrating a transmitter employing yet another exemplary pulling mitigation mechanism according to an embodiment of the present invention. The transmitter 2300 includes a time-to-digital converter (TDC) 2302 and the aforementioned clock source 2002, PA 2004 and DC voltage tuning circuit 2006. For example, the transmitter 2300 is an ADPLL-based transmitter, and the TDC 2303 is reused in the feedback phase control. The DC voltage $V_{DC}$ supplied to the PA 2004 is also shared with the TDC 2302. The timing delay characteristics of the TDC 2302 and the PA 2004 are highly correlated hence the TDC could be used as a 'proxy' for the PA delay. The TDC 2302 is arranged to digitally output the quantized time difference between the generated RF_IN clock and a reference clock (not shown). Thus generated TDC output TDC_OUT can be used to estimate the inverter delay. The DC voltage tuning circuit 2006 is arranged to operate in response to calculating of the TDC output TDC_OUT, where the calculating of the TDC output TDC_OUT is operable to provide an estimate of the TDC element delay characteristic (e.g., an inverter delay). Hence, based on the estimate of the TDC element delay characteristic, the DC voltage tuning circuit 2006 is arranged to adjust the DC voltage $V_{DC}$ for substantially maintaining the TDC element delay characteristic.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-stage digitally-controlled power amplifier (DPA), comprising:
    a radio-frequency (RF) clock input, arranged for receiving an RF clock;
    an amplitude control word (ACW) input, arranged for receiving a digital ACW signal;
    a plurality of drivers, coupled to said RF clock, said drivers arranged for producing a plurality of intermediate signals, wherein at least one driver of said drivers is responsive to at least one bit of said digital ACW signal; and
    an output stage, coupled to said intermediate signals, said output stage arranged for producing an output signal.

2. The multi-stage DPA of claim 1, wherein said output stage comprises a plurality of output cells.

3. The multi-stage DPA of claim 2, wherein at least one of said output cells is responsive to at least one bit of said digital ACW signal.

4. The multi-stage DPA of claim 2, wherein each of said output cells comprises an input port and an output port, said input port is coupled to one of said intermediate signals, and output ports of said output cells are coupled to each other.

5. The multi-stage DPA of claim 1, wherein said at least one driver responsive to said at least one bit is a logic gating operation.

6. The multi-stage DPA of claim 1, wherein said drivers comprise a plurality of first drivers disposed at a first stage and a plurality of second drivers disposed at a second stage immediately following said first stage, and each of said first drivers is coupled to at least one of said second drivers.

7. The multi-stage DPA of claim 6, wherein a number of said second drivers is greater than a number of said first drivers.

8. The multi-stage DPA of claim 7, wherein said first drivers and said second drivers include said at least one driver responsive to said at least one bit of said digital ACW signal.

9. The multi-stage DPA of claim 6, wherein a number of said second drivers is equal to a number of said first drivers.

10. The multi-stage DPA of claim 9, wherein said first drivers and said second drivers include said at least one driver responsive to said at least one bit of said digital ACW signal.

11. The multi-stage DPA of claim 1, wherein said drivers comprise at least one driver that is directed connected to said RF clock input and is not responsive to any bit of said digital ACW signal.

12. A multi-stage digitally-controlled power amplifier (DPA), comprising:
    a radio-frequency (RF) clock input, arranged for receiving an RF clock;
    an amplitude control word (ACW) input, arranged for receiving a digital ACW signal; and
    a plurality of cells, arranged for producing an output signal according to said RF clock and said digital ACW signal, wherein part of said cells are arranged in a tree topology.

13. The multi-stage DPA of claim 12, wherein said cells comprise:
    a plurality of drivers of a driver stage, coupled to said RF clock, said drivers arranged for producing a plurality of intermediate signals; and
    a plurality of output cells of an output stage, coupled to said intermediate signals, said output cells arranged for producing said output signal.

14. The multi-stage DPA of claim 13, wherein at least one of said drivers is responsive to at least one bit of said digital ACW signal.

15. The multi-stage DPA of claim 13, wherein at least one of said output cells is responsive to at least one bit of said digital ACW signal.

16. The multi-stage DPA of claim 13, wherein each of said output cells comprises an input port and an output port, said input port is coupled to one of said intermediate signals, and output ports of said output cells are coupled to each other.

17. The multi-stage DPA of claim 13, wherein said drivers comprise at least one driver that is directed connected to said RF clock input and is not responsive to any bit of said digital ACW signal.

* * * * *